United States Patent
Ristic et al.

(10) Patent No.: US 9,843,162 B2
(45) Date of Patent: Dec. 12, 2017

(54) LIGHT-EMITTING ASSEMBLY HAVING A CARRIER

(71) Applicant: OSRAM Opto Semiconductors GmbH, Regensburg (DE)

(72) Inventors: Jelena Ristic, Regensburg (DE); Martin Straβburg, Donaustauf (DE); Alfred Lell, Maxhütte-Haidhof (DE); Uwe Strauβ, Bad Abbach (DE)

(73) Assignee: OSRAM Opto Semiconductors GmbH (DE)

( * ) Notice: Subject to any disclaimer, the term of this patent is extended or adjusted under 35 U.S.C. 154(b) by 50 days.

(21) Appl. No.: 14/895,120

(22) PCT Filed: Jun. 3, 2014

(86) PCT No.: PCT/EP2014/061432
§ 371 (c)(1),
(2) Date: Dec. 1, 2015

(87) PCT Pub. No.: WO2014/202378
PCT Pub. Date: Dec. 24, 2014

(65) Prior Publication Data
US 2016/0126702 A1   May 5, 2016

(30) Foreign Application Priority Data
Jun. 20, 2013 (DE) .......... 10 2013 211 707

(51) Int. Cl.
*H01S 5/00* (2006.01)
*H01S 5/34* (2006.01)
(Continued)

(52) U.S. Cl.
CPC .......... *H01S 5/3428* (2013.01); *H01L 33/007* (2013.01); *H01L 33/16* (2013.01);
(Continued)

(58) Field of Classification Search
CPC .. H01S 5/3428; H01S 5/4025; H01S 5/34333; H01S 5/18377; H01S 5/02236;
(Continued)

(56) References Cited

U.S. PATENT DOCUMENTS

2008/0036038 A1* 2/2008 Hersee ............... B82Y 20/00
257/615
2008/0305568 A1 12/2008 Huang et al.
(Continued)

FOREIGN PATENT DOCUMENTS

DE     10 2011 056 1        6/2013
EP      2 509 119 A1       10/2012
(Continued)

OTHER PUBLICATIONS

Notice of Reasons for Rejection dated Oct. 11, 2016, of corresponding Japanese Application No. 2016-520356 in English.

Primary Examiner — Yuanda Zhang
(74) Attorney, Agent, or Firm — DLA Piper LLP (US)

(57) ABSTRACT

An assembly includes a carrier and a structure having a core formed on the carrier, wherein the core has a longitudinal extension having two end regions, a first end region is arranged facing the carrier and a second end region is arranged facing away from the carrier, the core is formed as electrically conductive at least in an outer region, the region is at least partially covered with an active zone layer, the active zone layer generates electromagnetic radiation, a mirror layer is provided at least in one end region of the core to reflect electromagnetic radiation in a direction, a first electrical contact layer contacts an electrically conductive region of the core, and a second contact layer contacts the active zone layer.

16 Claims, 19 Drawing Sheets

(51) Int. Cl.

| | | |
|---|---|---|
| *H01L 33/24* | (2010.01) | |
| *H01S 5/022* | (2006.01) | |
| *H01S 5/343* | (2006.01) | |
| *H01L 33/00* | (2010.01) | |
| *H01L 33/16* | (2010.01) | |
| *H01L 33/40* | (2010.01) | |
| H01S 5/02 | (2006.01) | |
| H01S 5/10 | (2006.01) | |
| H01S 5/183 | (2006.01) | |
| H01S 5/40 | (2006.01) | |
| H01S 5/42 | (2006.01) | |
| H01L 27/15 | (2006.01) | |
| H01L 33/10 | (2010.01) | |
| H01L 33/46 | (2010.01) | |

(52) U.S. Cl.
CPC ............ *H01L 33/24* (2013.01); *H01L 33/405* (2013.01); *H01S 5/0217* (2013.01); *H01S 5/02236* (2013.01); *H01S 5/18377* (2013.01); *H01S 5/34333* (2013.01); *H01S 5/4025* (2013.01); *H01L 27/156* (2013.01); *H01L 33/10* (2013.01); *H01L 33/46* (2013.01); *H01S 5/0207* (2013.01); *H01S 5/1042* (2013.01); *H01S 5/1835* (2013.01); *H01S 5/341* (2013.01); *H01S 5/4087* (2013.01); *H01S 5/423* (2013.01)

(58) Field of Classification Search
CPC ...... H01S 5/0217; H01S 5/1042; H01S 5/341; H01S 5/423; H01S 5/0207; H01S 5/4087; H01S 5/1835; H01L 33/16; H01L 33/405; H01L 33/007; H01L 33/24; H01L 33/10; H01L 27/156; H01L 33/46
See application file for complete search history.

(56) References Cited

U.S. PATENT DOCUMENTS

| | | | |
|---|---|---|---|
| 2009/0068411 | A1 | 3/2009 | Hong et al. |
| 2010/0276664 | A1* | 11/2010 | Hersee ................... B82Y 20/00 257/15 |
| 2010/0327258 | A1 | 12/2010 | Lee et al. |
| 2011/0140072 | A1* | 6/2011 | Varangis ................. B82Y 20/00 257/9 |
| 2011/0240959 | A1 | 10/2011 | Konsek et al. |
| 2011/0254034 | A1 | 10/2011 | Konsek et al. |
| 2012/0061646 | A1 | 3/2012 | Yi et al. |
| 2012/0235117 | A1* | 9/2012 | Fukui ................. H01L 21/02488 257/13 |
| 2012/0273794 | A1 | 11/2012 | Saito et al. |
| 2013/0341658 | A1* | 12/2013 | Lee ........................ H01L 33/14 257/91 |
| 2014/0209859 | A1* | 7/2014 | Cha ........................ H01L 33/08 257/13 |
| 2014/0301420 | A1* | 10/2014 | Kawaguchi ......... H01S 5/18341 372/45.012 |
| 2014/0353581 | A1* | 12/2014 | Strassburg .............. H01L 33/08 257/13 |

FOREIGN PATENT DOCUMENTS

| | | |
|---|---|---|
| JP | 10-321910 A | 12/1998 |
| WO | 2013/128540 A1 | 9/2013 |
| WO | 2014/053445 A1 | 4/2014 |
| WO | 2014/056762 A2 | 4/2014 |

* cited by examiner

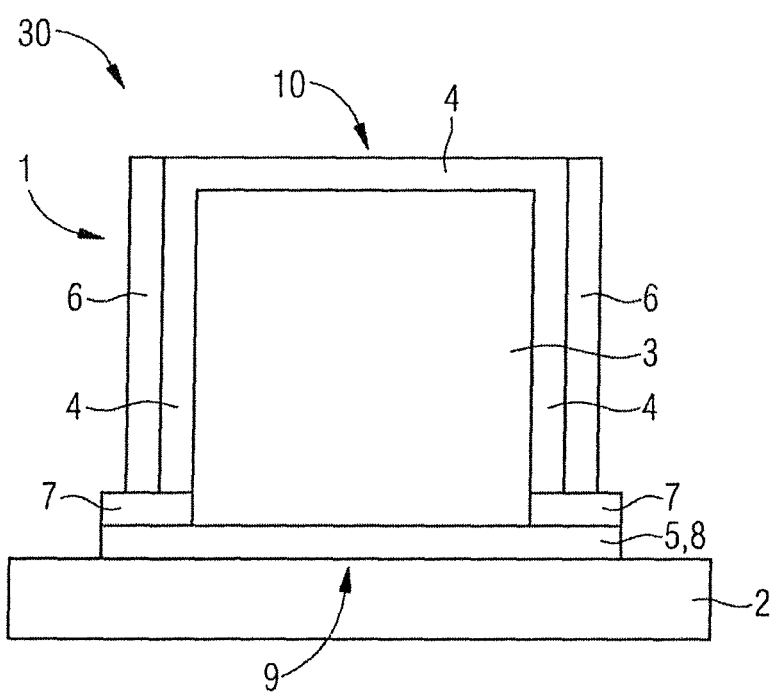
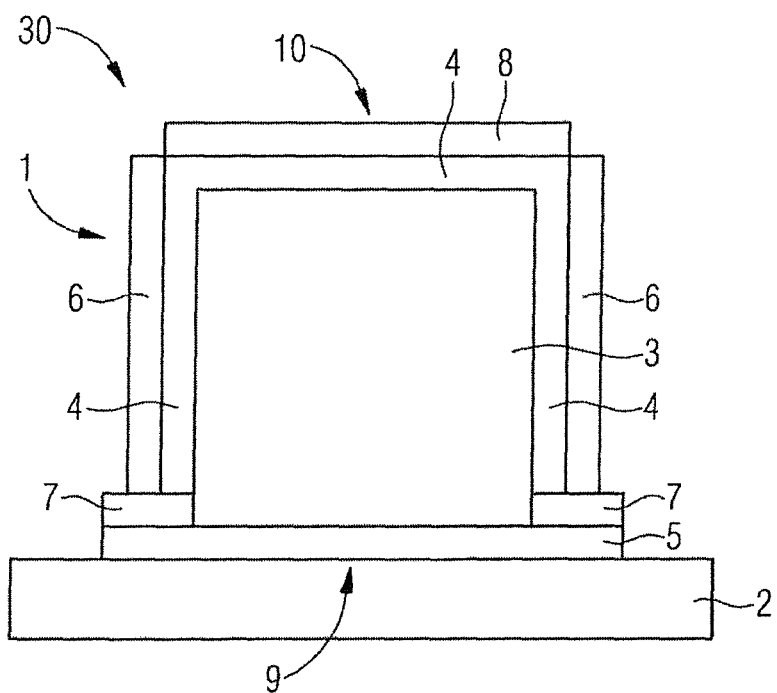

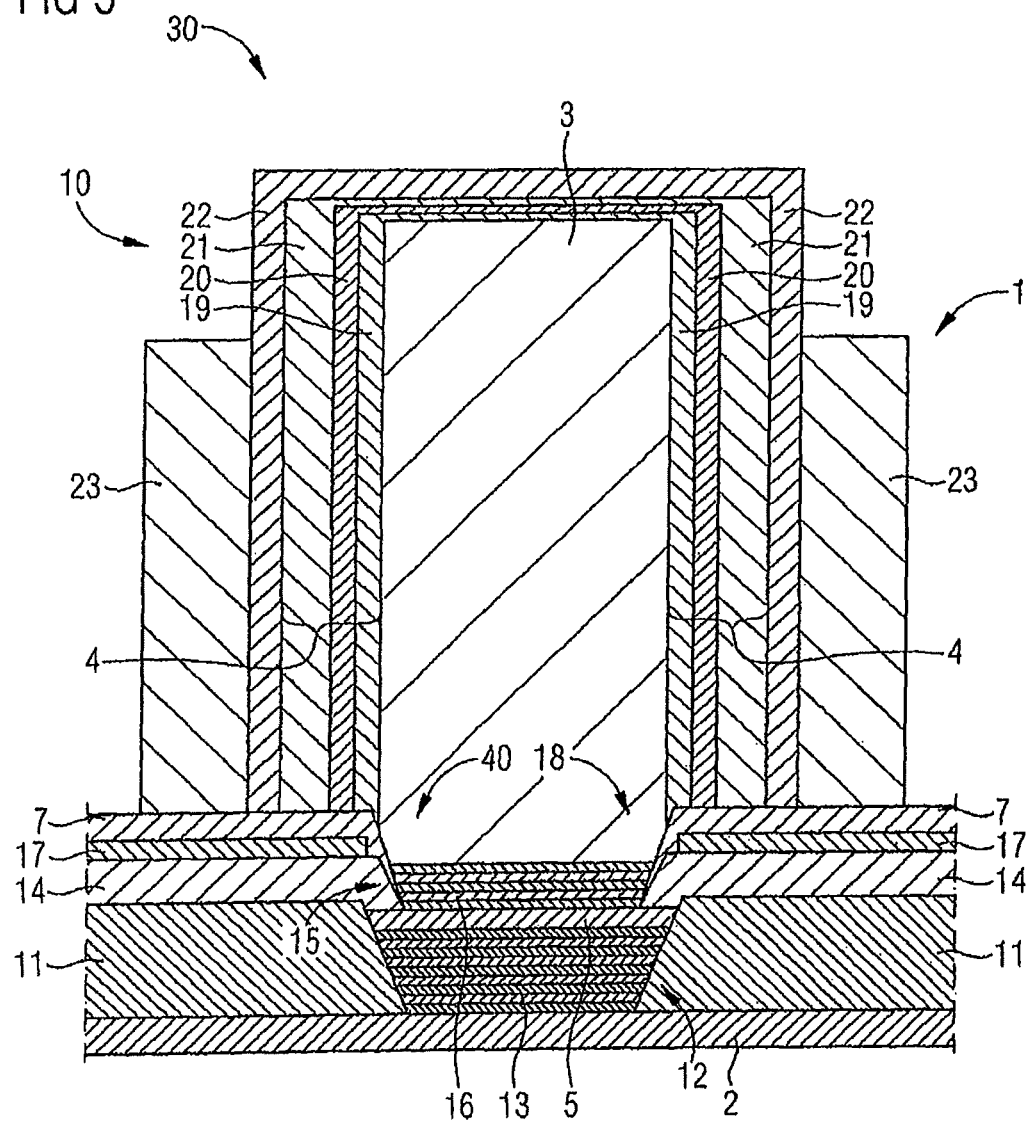

LIGHT-EMITTING ASSEMBLY HAVING A CARRIER

TECHNICAL FIELD

This disclosure relates to an assembly having a carrier, an array having multiple assemblies, and a method of producing an assembly.

BACKGROUND

An assembly having nanorods which have an active zone that generates light is known from US 2009/0068411 A1. It could nonetheless be helpful to provide an improved assembly, an improved array, and an improved method of producing an assembly having an oblong structure having an active zone layer.

SUMMARY

We provide an assembly including a carrier and a structure having a core formed on the carrier, wherein the core has a longitudinal extension having two end regions, a first end region is arranged facing toward the carrier and a second end region is arranged facing away from the carrier, the core is formed as electrically conductive at least in an outer region, the region is at least partially covered with an active zone layer, the active zone layer generates electromagnetic radiation, a mirror layer is provided at least in one end region of the core to reflect electromagnetic radiation in a direction, a first electrical contact layer contacts an electrically conductive region of the core, and a second contact layer contacts the active zone layer.

We also provide an array including multiple assemblies including a carrier and a structure having a core formed on the carrier, wherein the core has a longitudinal extension having two end regions, a first end region is arranged facing toward the carrier and a second end region is arranged facing away from the carrier, the core is formed as electrically conductive at least in an outer region, the region is at least partially covered with an active zone layer, the active zone layer generates electromagnetic radiation, a mirror layer is provided at least in one end region of the core to reflect electromagnetic radiation in a direction, a first electrical contact layer contacts an electrically conductive region of the core, and a second contact layer contacts the active zone layer, wherein the first and/or the second contact layer of at least two assemblies are formed independently of one another and the two assemblies can be supplied separately and independently of one another with current to generate electromagnetic radiation.

We further provide a method of producing the assembly including a carrier and a structure having a core formed on the carrier, wherein the core has a longitudinal extension having two end regions, a first end region is arranged facing toward the carrier and a second end region is arranged facing away from the carrier, the core is formed as electrically conductive at least in an outer region, the region is at least partially covered with an active zone layer, the active zone layer generates electromagnetic radiation, a mirror layer is provided at least in one end region of the core to reflect electromagnetic radiation in a direction, a first electrical contact layer contacts an electrically conductive region of the core, and a second contact layer contacts the active zone layer, including producing an intermediate product on a growth substrate, where-in the intermediate product at least includes the core, removing the intermediate product from the growth substrate and applying the intermediate product to a carrier to finish the assembly.

We further yet provide an assembly including a carrier and a structure having a core formed on the carrier, wherein the core has a longitudinal extension having two end regions, a first end region is arranged facing toward the carrier and a second end region is arranged facing away from the carrier, the core is formed as electrically conductive at least in an outer region, the region is at least partially covered with an active zone layer, the active zone layer generates electromagnetic radiation, a mirror layer is provided at least in one end region to reflect electromagnetic radiation in a direction, a first electrical contact layer contacts an electrically conductive region of the core, a second contact layer contacts the active zone layer, the mirror layer is provided on a first end region of the core facing toward the carrier, and/or the mirror layer is provided on the end region of the core facing away from the carrier, a direction of a reflection of the electromagnetic radiation is arranged along a longitudinal axis of the core, the mirror layer has an electrically conductive first mirror layer arranged on a first end region of the core, the first contact layer is applied to the first mirror layer, a second mirror layer is applied to the first contact layer, the second mirror layer is electrically insulating, and the first mirror layer has a lower degree of reflection than the second mirror layer.

BRIEF DESCRIPTION OF THE DRAWINGS

FIG. 1 shows a schematic illustration of a first example of an assembly.

FIG. 2 shows a schematic illustration of a second example of an assembly.

FIG. 3 shows a schematic illustration of a third example of an assembly.

LIST OF REFERENCE NUMERALS

Figure 4:
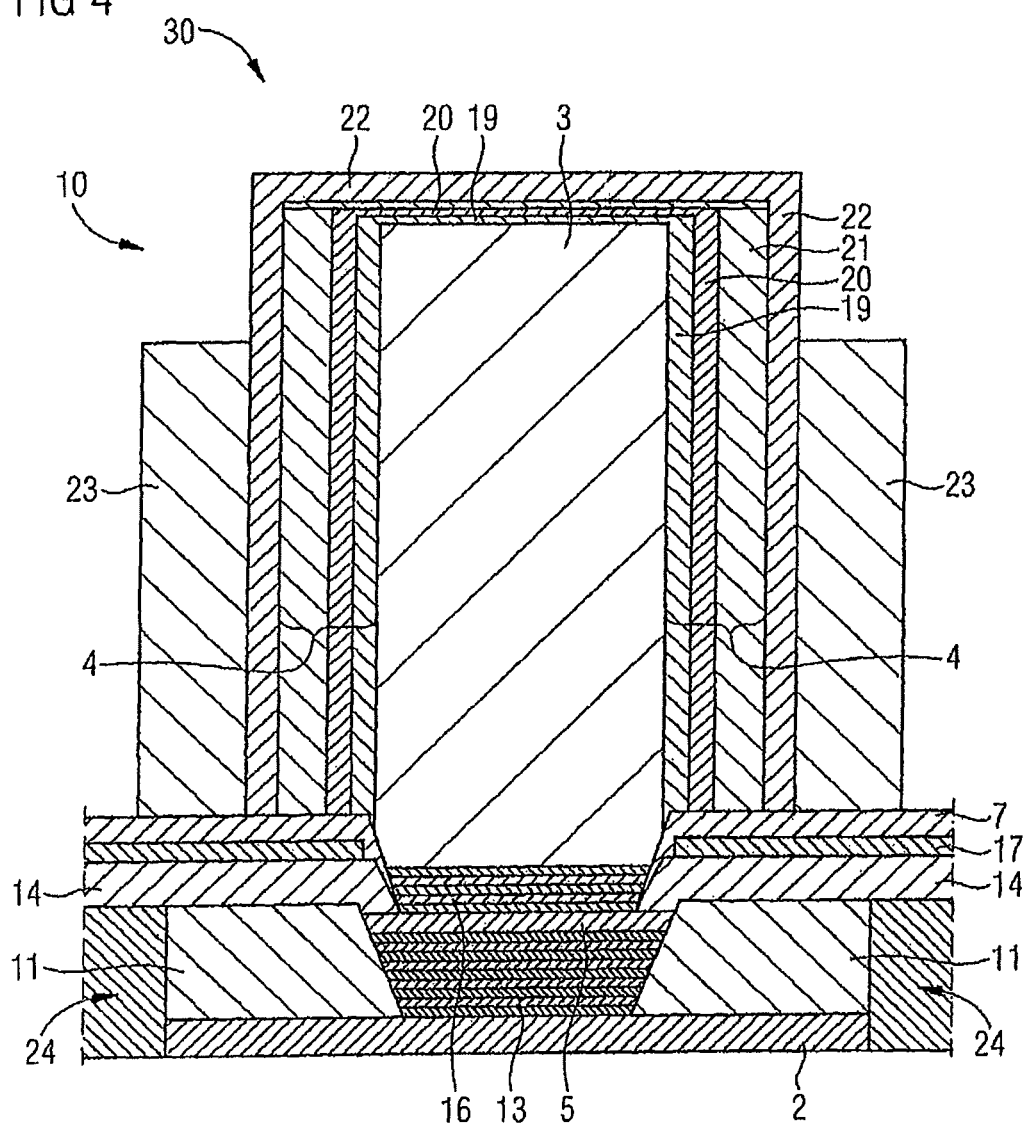
FIG. 4 shows a schematic illustration of a fourth example of an assembly.

1 structure
2 carrier
3 core 4 zone layer
5 first contact layer
6 second contact layer
7 insulation layer
8 mirror layer
9 first end region
10 second end region
11 first mask layer
12 opening
13 second mirror layer
14 contact layer
15 second opening
16 first mirror layer
17 second mask layer
18 third opening
19 first partial layer
20 second partial layer
21 third partial layer
22 contact layer
23 contact layer
24 through contact
25 array
26 first row
27 second row
28 third row
30 assembly
31 first region
32 second region
33 third region
34 conductor strip
35 insulating layer
36 further layer
37 metallization
40 fourth opening
41 first column
42 second column
43 third column
44 growth substrate
45 mask layer
46 further opening

DETAILED DESCRIPTION

One advantage of our assembly is that as a result of the selected structure, a high level of light power is generated, which is additionally amplified by the mirror layer. A fixed reflection direction of the electromagnetic radiation is given by the mirror layer. The power of the electromagnetic radiation emitted in the emission direction is thus increased. The core has a longitudinal extension having two end regions, wherein a first end region is arranged facing toward the carrier and a second end region is arranged facing away from the carrier. Due to formation of a column-type structure, in particular, having a quasi-three-dimensional active zone layer, which at least partially encloses a core of the structure, it is possible to generate electromagnetic radiation having high light power in a tight space.

An insulation layer may be provided between the active zone layer and the first contact layer and/or between the first contact layer and the second contact layer. In this manner, reliable electrical separation of the layers is achieved with a compact construction of the assembly.

The mirror layer may be provided on the end region of the core facing toward the carrier. In this manner, an emission direction of the electromagnetic radiation away from the carrier can be defined.

The mirror layer may be provided on the end region of the core facing away from the carrier. In this manner, the emission direction of the electromagnetic radiation can be defined in the direction toward the carrier.

Mirror layers may be formed on opposing ends of the core. In this case, one of the mirror layers has a lower degree of reflection. The electromagnetic radiation can therefore be reflected between the mirror layers for a higher light power and can be decoupled via the mirror layer having the lower degree of reflection. For example, a standing wave can also be generated between the mirror layers in this manner. This can be used, in particular, to generate monochromatic electromagnetic radiation, i.e., laser radiation.

The mirror layer may be electrically conductive and represents the first contact layer. In this example, the core can be electrically contacted over a large area. A uniform current distribution in the core is therefore achieved. In addition, the entire cross section of the core can be provided with the mirror layer and therefore a high degree of reflection can be achieved.

The mirror layer may be in the form of two mirror layers. The electrically conductive first mirror layer is arranged on the end region of the core. The first contact layer is applied to the first mirror layer. A second mirror layer is applied to the first contact layer, wherein the second mirror layer is electrically insulating. In addition, the first contact layer is transmissive at least for a partial spectrum of the electromagnetic radiation.

A large-area electrical contact of the core is achieved by the described assembly. In addition, a great degree of reflection is achieved since a higher degree of reflection is possible due to provision of the two mirror layers.

The degree of reflection of the first mirror layer can be less than the degree of reflection of the second mirror layer. In addition, a compact construction is possible due to the selected assembly.

An electrical through contact may be connected in an electrically conductive manner to the first contact layer, and may be provided in the carrier. In this manner, a simple electrical contact of the first contact layer through the carrier is achieved.

The first contact layer may be in contact with a first partial layer of the active zone layer, which adjoins the core. A low surface current in a high current flow is thus enabled.

The active zone layer may enclose the core in the form of a jacket along a longitudinal axis. In this manner, a large area of the zone layer is provided with a small area requirement. A high power density of the electromagnetic radiation is thus achieved.

The second contact layer may laterally contact the active zone on an outer side in relation to the column-type structure. In this manner, simple electrical contacting of the outer side of the active zone layer is enabled.

The mirror layer may be in the form of a layer sequence having multiple layers. A great degree of reflection can be achieved in this manner.

The described array has the advantage that multiple assemblies that generate electromagnetic radiation are provided, wherein at least two assemblies can be supplied independently of one another with current. In this manner, for example, the light power of the array, the color of the array, and/or color areas of the array can be individually controlled.

In one example of the array, multiple contact layers are provided for the first and/or the second contact layer, which are formed as conductor strips. In addition, multiple conductor strips formed independently of one another are provided. An individual activation of partial groups of the assemblies of the array is possible in this manner.

The conductor strips may be arranged in various levels one above another, in particular in the carrier. A space-saving assembly of the conductor strips is enabled in this manner.

The described method has the advantage that the assembly can be produced simply and cost-effectively. An intermediate product comprising at least the core may be produced first. Subsequently, the intermediate product is applied to a carrier and the assembly is finished. In this manner, a high level of flexibility is provided in producing the assembly or in production of an array. The intermediate product can comprise both the core and also the active zone layer. The processes for production of the core and the zone layer can thus be optimally selected. In addition, differently constructed and/or shaped cores can be combined with one another on a carrier.

Examples of our methods, assemblies and arrays will be explained in greater detail on the basis of the following figures.

An oblong structure is a structure at least as tall as it is wide, in particular taller than it is wide. The structure can be cylindrical, pyramidal, cuboid, or can also have other shapes, cross sections, or surface structures.

FIG. 1 shows, in a schematic cross section, an assembly 30 having a structure 1 applied to a carrier 2. The structure 1 is formed as oblong and has an oblong core 3. The core 3 has a longitudinal extension having two end regions 9, 10, wherein a first end region 9 is arranged facing toward the carrier 2 and a second end region 10 is arranged facing away from the carrier 2. The core 3 is therefore arranged having its longitudinal extension not parallel to a plane of the carrier 2, but rather at an angle greater than 0° and less than 180°. For example, the core 3 is arranged having its longitudinal extension perpendicular to the plane of the carrier 2. The core 3 is arranged on a first contact layer 5. The first contact layer 5 is arranged on the carrier 2. The core 3 has a cylindrical shape, for example. The core 3 can also have a pyramid shape. In addition, the core 3 can also widen or taper in cross section starting from the carrier 2.

The core 3 is enclosed by an active zone layer 4. The zone layer 4 encloses both the lateral edge region and also a second end region 10. The second end region 10 is arranged opposite to the first end region 9. The first end region 9 is arranged on the first contact layer 5. In the illustrated example, the first contact layer 5 is formed simultaneously as a mirror layer 8. The zone layer 4 is at least partially covered with a second contact layer 6, in particular enclosed by the second contact layer 6. A first insulation layer 7 is arranged between the zone layer 4 and the first contact layer 5 or between the first contact layer 5 and the second contact layer 6. The zone layer 4 and the second contact layer 6 are therefore not in direct electrical contact with the first contact layer 5. The first and the second contact layer 5, 6 connect to different electrical voltage potentials to operate the active zone layer 4.

The core 3 is at least partially produced from an electrically conductive material. In particular, at least an outer jacket region of the core 3 is formed as electrically conductive. The entire core 3 can be produced from an electrically conductive material, in particular from a semiconductor material. In addition, the active zone layer 4 can also be produced from an electrically conductive semiconductor material. The zone layer 4 represents a layer that generates electromagnetic radiation and is formed, for example, from a semiconductor material having a pn junction. The p side can be arranged on the inside and the n side on the outside or the n side can be arranged on the inside and the p side on the outside.

In the illustrated example, for example, the core 3 is formed from a positively doped semiconductor material. In this example, the zone layer 4 is formed such that the p side rests on the core 3 and the n side is formed on the outer side of the zone layer 4. The carrier 2 is produced from an electrically insulating material, for example. The core 3 is supplied with current via the electrically conductive mirror layer 8. The zone layer 4 is supplied from the outer side with current via the second contact layer 6. In this manner, the zone layer 4 is supplied with current to generate electromagnetic radiation.

The electromagnetic radiation is reflected by the mirror layer 8 and emitted in a direction away from the carrier 2. A large area of the zone layer 4 is provided by formation of the two-dimensional zone layer 4. In this manner, a large amount of power of electromagnetic radiation can be generated in a small space. By way of the provision of the mirror layer 8, the electromagnetic radiation is emitted in a defined direction.

FIG. 2 shows a further example of an assembly 30 formed essentially according to the example of FIG. 1, wherein the first contact layer 5 is not formed as a mirror layer, however. In this example, the mirror layer 8 is arranged opposite at the second end region 10. The electromagnetic radiation generated by the active zone layer 4 is reflected in the direction toward the carrier 5 by the mirror layer 8.

Mirror layers can be formed on both sides. For example, in the example of FIG. 2, the first contact layer 5 can additionally be formed in the form of a mirror layer 8. In the example of FIG. 2, the mirror layer 8 is arranged directly on the second end region 10 of the core 3 in the illustrated example. Therefore, in this example, the active zone layer 4 is only applied on the outer lateral surface of the core 3. The active zone layer 4 can also be arranged on the second end region 10 of the core 3, as shown, and the mirror layer 8 can be formed on the outer side of the zone layer 4 at the second end region 10. In this example, however, it is to be ensured that the zone layer 4 is transmissive to the electromagnetic radiation. In a further example, the zone layer 4 on the second end region 10 can also be omitted and the mirror layer 8 can be formed directly on the second end region 10 on the core 3.

The mirror layer 8 can be formed, for example, from aluminum, indium, gallium nitride layers, and can be formed, for example, in the form of a DBR mirror. The degree of reflection can be greater than 95%, for example, preferably greater than 99%. In addition, the mirror layer can also be in the form of a dielectric layer and can be constructed, for example, from $ZrO_2$, $Al_2O_3$, $TiO_2$, $Ta_2O_5$, ZnO, $SiO_2$, $Si_3N_4$, or $HfO_2$. The core 3 can have a diameter of 20 nm to 50 µm, for example. Furthermore, the core 3 can have a diameter of 100 nm to 50 µm. In addition, the core can also have a larger diameter. Furthermore, the core can have a ratio of the footprint to the length of 1 to 1000. The core preferably has an aspect ratio of 20 to 100. The core 3 can be formed, for example, from a negatively doped semiconductor material. The zone layer 4 can be formed, for example, from an aluminum, indium, and/or gallium nitride structure, wherein one or more quantum well structures are provided. In addition, aluminum, indium, gallium nitride barrier layers can be provided between the quantum wells. The active zone layer can be formed to emit one or more wavelengths of electromagnetic radiation. The outer side of the active zone 4 can be positively doped. The carrier 2 may be transmissive to the electromagnetic radiation generated by the zone layer 4. In this example, the electromagnetic radiation can be emitted in the direction of the carrier and through the carrier.

Other materials, in particular other semiconductor materials, can also be used to form the active zone layer 4 and/or the core 3.

FIGS. 1 and 2 show assemblies 30 that generate electromagnetic radiation which is preferably emitted along a longitudinal axis of the core 3. The electromagnetic radiation can be narrowband and can represent laser radiation. In this example, FIGS. 1 and 2 show laser assemblies that emit electromagnetic radiation along the longitudinal axis of the structure 1. The core 3 can preferably represent a semiconductor material epitactically deposited and is preferably aligned having one surface in the C level parallel to the surface of the carrier 2. The C level of the core 3 therefore represents the end surface of the first or the second end region 9, 10, respectively.

FIG. 3 shows a schematic cross section through a further example of an assembly 30. A first mask layer 11 is applied to a carrier 2. The first mask layer 11 is formed, for example, from silicon oxide, silicon nitride, hafnium oxide, titanium oxide, zirconium oxide, or thallium oxide. An opening 12 is introduced into the first layer 11. The opening 12 preferably extends up to the carrier 2. The opening 12 can have a diameter of 50 nm to 50 µm, preferably 500 nm to 5 µm. Depending on the desired structure, the opening 12 is formed in the form of a polygon or a circle. A second mirror layer 13 is arranged in the opening 12. The second mirror layer 13 consists, for example, of a layer sequence of alternating aluminum, indium, gallium nitride layers, wherein the second mirror layer 13 is formed, for example, as a DBR layer (distributed Bragg reflector). The semiconductor layers can be formed without substantial doping. The second mirror layer 13 has a degree of reflection, for example, which is greater than 95%, preferably greater than 99%. The degree of reflection is understood as the ratio of the incident power in relation to the reflected power.

The second mirror layer 13 can also be formed from dielectric layers that preferably have a crystal structure. For example, zirconium oxide or hafnium oxide can be used as the material for the dielectric layers.

A first contact layer 5 is applied to the second mirror layer 13. The first contact layer 5 is preferably still arranged inside the opening 12. The first contact layer 5 can be formed, for example, in the form of a doped semiconductor layer. For example, a negatively doped or highly negatively doped aluminum, indium, gallium nitride layer can be used. In addition, a conductive light-transmissive coating in the form of an indium-tin oxide (ITO) can alternatively or additionally be used. A contact layer 14 is applied to the first ground layer 12, this contact layer protruding into the region of the opening 12 and being connected in an electrically conductive manner to edge regions of the first contact layer 5. The contact layer 14 can also consist of a doped semiconductor material, in particular a highly doped semiconductor material. For example, a negatively doped gallium nitride or a negatively doped aluminum-indium-gallium nitride layer can be used. The contact layer 14 has a second opening 15 arranged in the region above the first contact layer 5 and extends through up to the first contact layer 5. A first mirror layer 16 is arranged in the second opening 15. The second opening 15 is preferably arranged centered above the first opening 12. The first mirror layer 16 can be formed from the same materials as the second mirror layer 13. The first mirror layer 16 is formed to be electrically conductive, however, to produce an electrically conductive contact between the first contact layer 5 and the core. The first mirror layer 16 can simultaneously represent the first contact layer. Therefore, formation of a separate first contact layer can be omitted or the first mirror layer 16 assumes this function.

A second mask layer 17 is applied to the contact layer 14. The second mask layer 17 has a third opening 18 arranged centered above the second opening 15 of the contact layer 14. A first insulation layer 7 has a fourth opening 40 arranged centered above the second opening 15 of the first mirror layer 16 and is applied above the second mask layer 18.

The insulation layer 7 may only cover the second mask layer 17. In a further example, the first insulation layer 7 can also be led up to the contact layer 14 and can cover it at least laterally, as shown in FIG. 3.

The first mirror layer 16 can also be omitted and only the second mirror layer 13 can be provided, for example, as an electrically conductive layer. In addition, the first contact layer 5 can also directly adjoin the core 3 and the second mirror layer 13 can adjoin the first contact layer 5.

In addition, the second mirror layer 13 can also be omitted and only the first mirror layer 16 can be provided, with or without first contact layer 5.

The core 3 is arranged on the first mirror layer 16. The core 3 has a longitudinal extension extending from a first end section 9 facing toward the carrier 2, up to a second end region 10 facing away from the carrier 2. In the illustrated example, both the side wall and also the second end region 10 are covered by the zone layer 4.

In the illustrated example, the zone layer 4 is in the form of three partial layers 19, 20, 21. The first partial layer 19 is applied directly to the surface of the core 3. The first partial layer 19 represents a negatively doped semiconductor layer. The second partial layer 20 representing the active zone is arranged on the first partial layer 19. At least one quantum well is formed in the active zone. A third partial layer 21 is arranged on the second partial layer 20. The third partial layer 21 represents a positively doped semiconductor layer. The first partial layer 19 can also be positively doped and the third partial layer 21 can be negatively doped. In this example, the core 3 is then also formed from a positively doped semiconductor material. Because of the deposition method, the layer thicknesses of the first, second, and third partial layers 19, 20, 21 can be greater along the side wall of the core 3 than in the region of the second end region 10.

A positively doped semiconductor layer representing a third contact layer 22 is applied to the third partial layer 21. A fourth contact layer 23 is arranged laterally on the third contact layer 22. The zone layer 4 can be formed such that wave guiding takes place in the core 3 along the longitudinal extension of the core 3. The outer side 24 of the core 3 can represent a nonpolar lateral surface of a crystal structure. In this manner, the thickness of the active zone, i.e., the second partial layer 20, can be formed to be greater. A greater electromagnetic power density can thus be generated.

The third partial layer 21 can be formed as a waveguide layer, in particular as an electron blocking layer (EBL). In addition, an intermediate layer (p plating) can be formed between the third contact layer 22 and the third partial layer 21. In the illustrated example, only the second end region 10 is electrically contacted via the first mirror layer 16. The contact layer 14 can also directly adjoin and electrically contact the first partial layer 19. The third contact layer 22 can be formed, for example, from a transparent conductive oxide (TCO), for example, indium-tin oxide. The third contact layer 22 corresponds in function to the second contact layer 6 of the examples of FIGS. 1 and 2. The fourth contact layer 23 can be formed as a metal layer, for example, and used to electrically contact the third contact layer 22 of the assembly 30.

A mirror layer 8 can also be provided in the second end region 10 of the assembly. The mirror layer 8 can be arranged directly on the core 3 or on the outer side of the active zone layer 4. In addition, the mirror layer 8 can have a lower degree of reflection than the first and/or the second mirror layer 16, 13.

FIG. 4 shows a further example of an assembly 30 designed essentially according to the example of FIG. 3. However, in contrast to the example of FIG. 3, the contact layer 14 is led downward via a through contact 24 in the layer 11 and the carrier 2. In this manner, the first contact layer 5 can be electrically contacted from the lower side.

The fourth contact layer 23 can be formed, for example, from a material transmissive to the electromagnetic radiation. In a further example, the fourth contact layer 23 can also be formed from a material not transmissive to the electromagnetic radiation. In this example, the fourth contact layer 23 can only be formed as a small ring, for example, which only has a low height in relation to the insulation layer 7. If the contact layer 23 is formed from a material transmissive to the electromagnetic radiation, nearly the entire lateral surface of the third contact layer 22 can be covered with the fourth contact layer 23.

A mirror layer 8 can also be provided in the second end region 10 of the assembly. The mirror layer 8 can be arranged directly on the core 3 or on the outer side of the active zone layer 4. In addition, the mirror layer 8 can have a lower degree of reflection than the first and/or the second mirror layer 16, 13.

Figure 5:
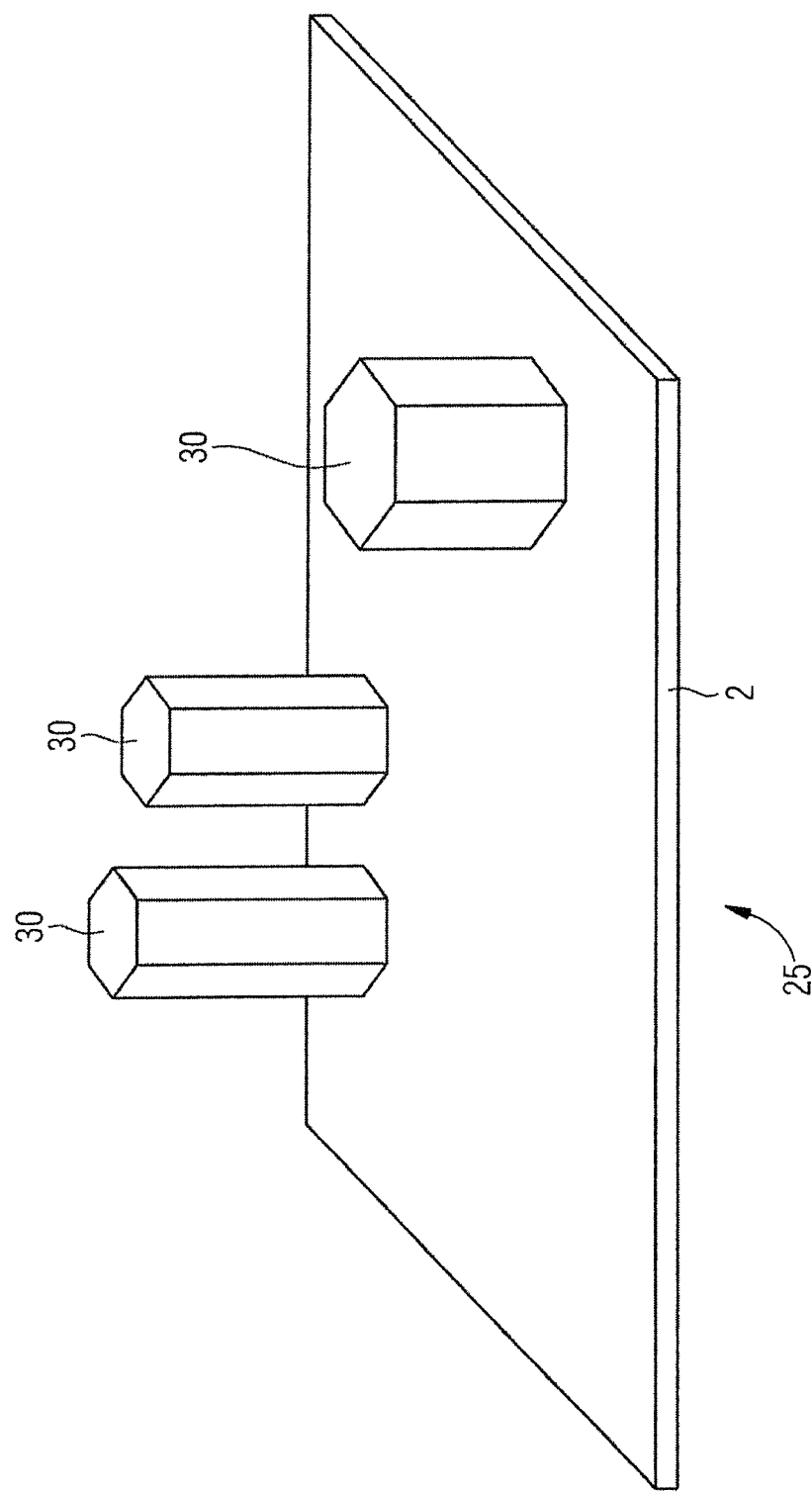
FIG. 5 shows a schematic illustration of a possible array of assemblies.

FIG. 5 shows a schematic illustration of a carrier 2, on which various assemblies 30 are provided. The assemblies 30 are designed, for example, according to FIGS. 1 to 4. The assemblies 30 have different heights, different thicknesses, and different footprints. Assemblies 30 having a hexagonal footprint and a round footprint are shown in FIG. 5. Details with respect to formation of the assemblies 30 are not specified in the illustration of FIG. 5.

Figure 6:
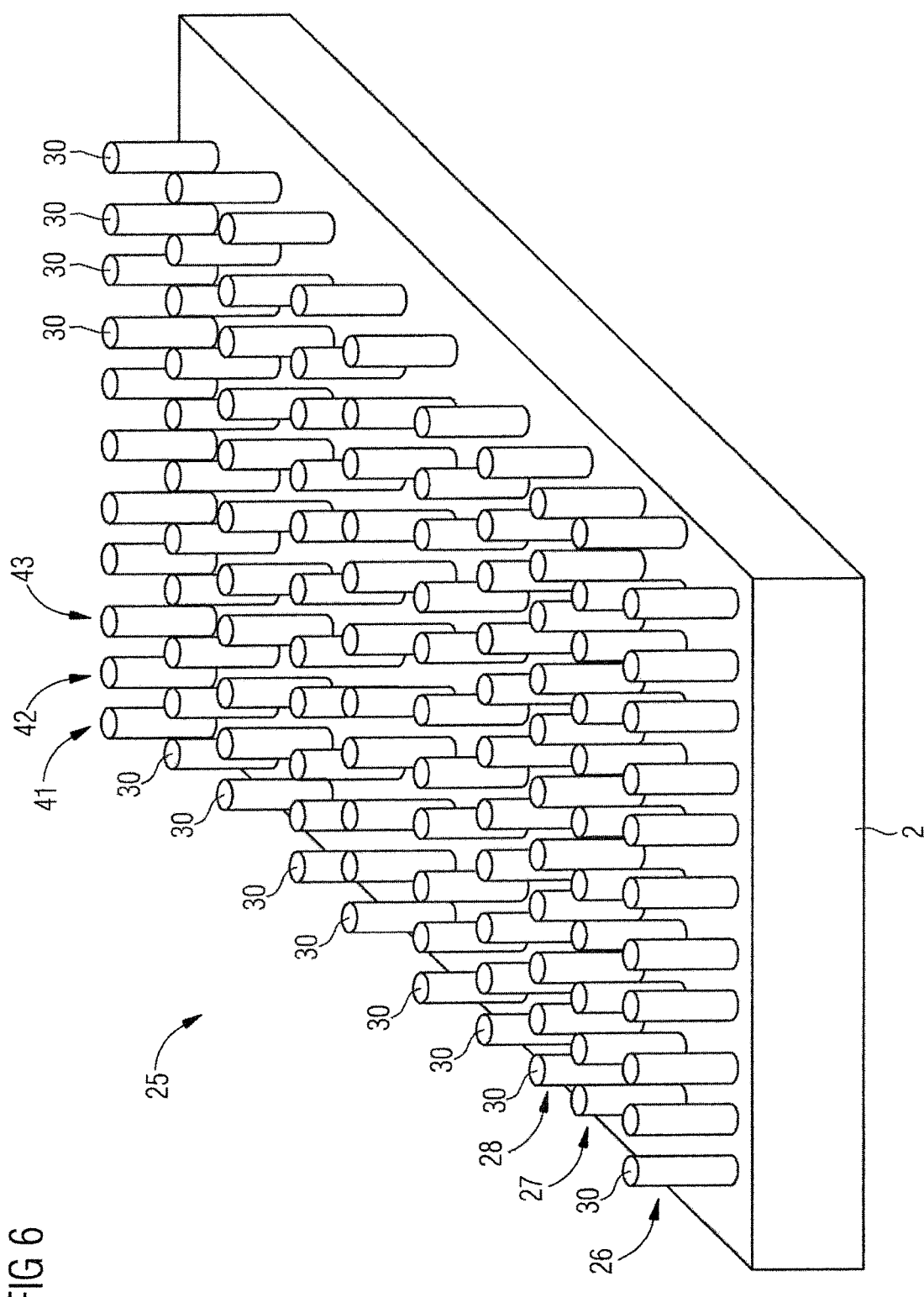
FIG. 6 shows a further example of an array.

FIG. 6 shows a schematic illustration of an array 25 having a plurality of assemblies 30 that can be designed according to the examples of FIGS. 1 to 4. In the illustrated example, the assemblies 30 are arranged like a lattice network in rows 26, 27, 28 and columns 41, 42, 43. The assemblies 30 can also be arranged in any arbitrary other pattern on the carrier 2. For example, assemblies 30, that generate electromagnetic radiation having the same wavelength spectrum, in particular having an identical wavelength focal point, in particular having the same color, can be arranged in a row 26. In addition, adjacent rows 26 can have assemblies that emit electromagnetic radiation having different wavelengths, in particular having different colors. For example, the assemblies 30 of the rows 26, 27, 28 can each emit light having a red or green or blue or yellow or cyan color.

The assemblies 30 having the same wavelength spectrum can also be provided in diagonally arranged rows or block-by-block in regions. Depending on the application, various regions or groups of assemblies 30 can emit identical or different wavelengths.

Figure 7:
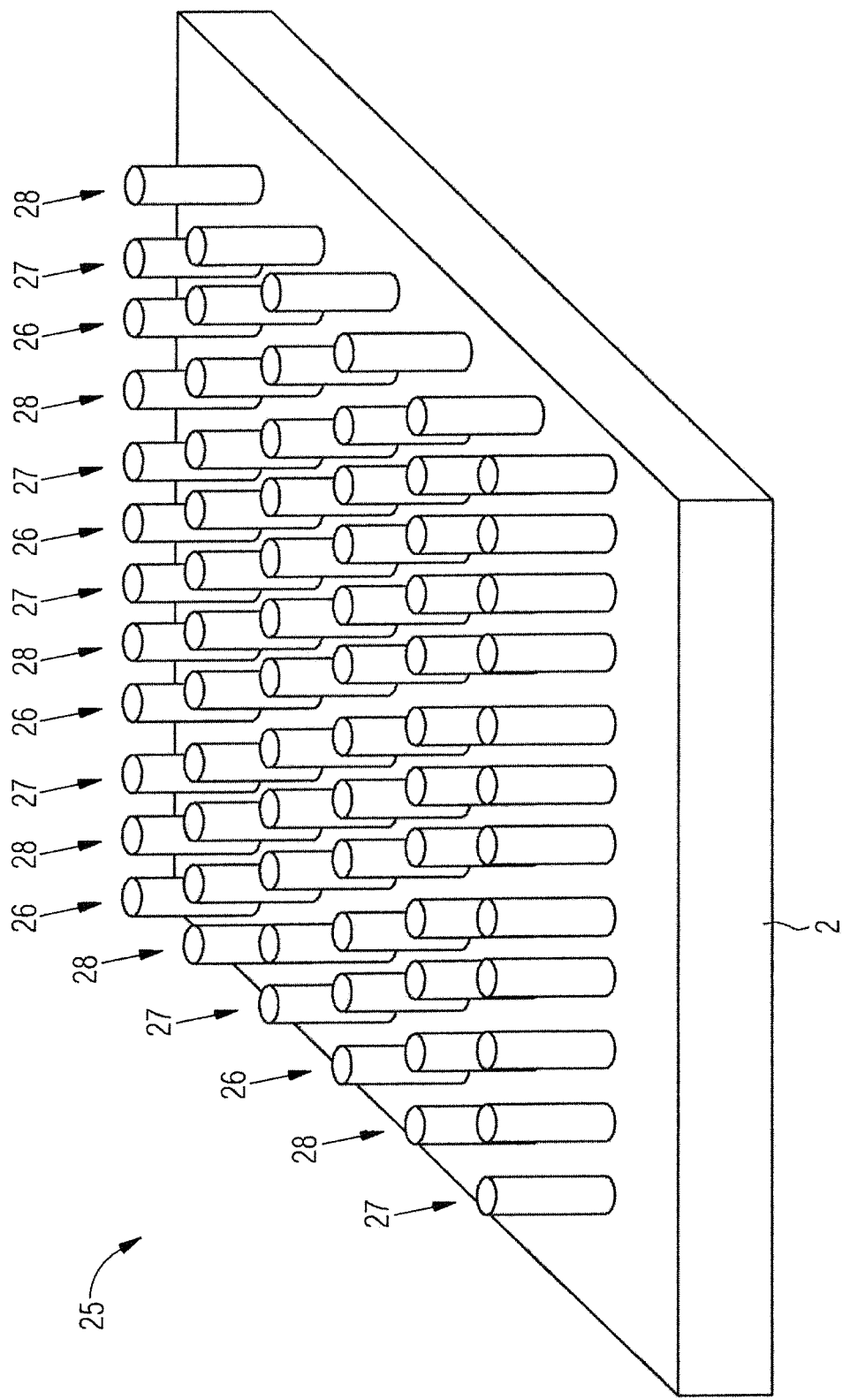
FIG. 7 shows a third example of an array.

FIG. 7 shows a schematic illustration of an array 25, in which the assemblies 30 having the same wavelength spectrum are arranged in diagonal rows 26, 27, 28, i.e., the same wavelength spectrum is emitted in each assembly of a diagonal row.

Figure 8:
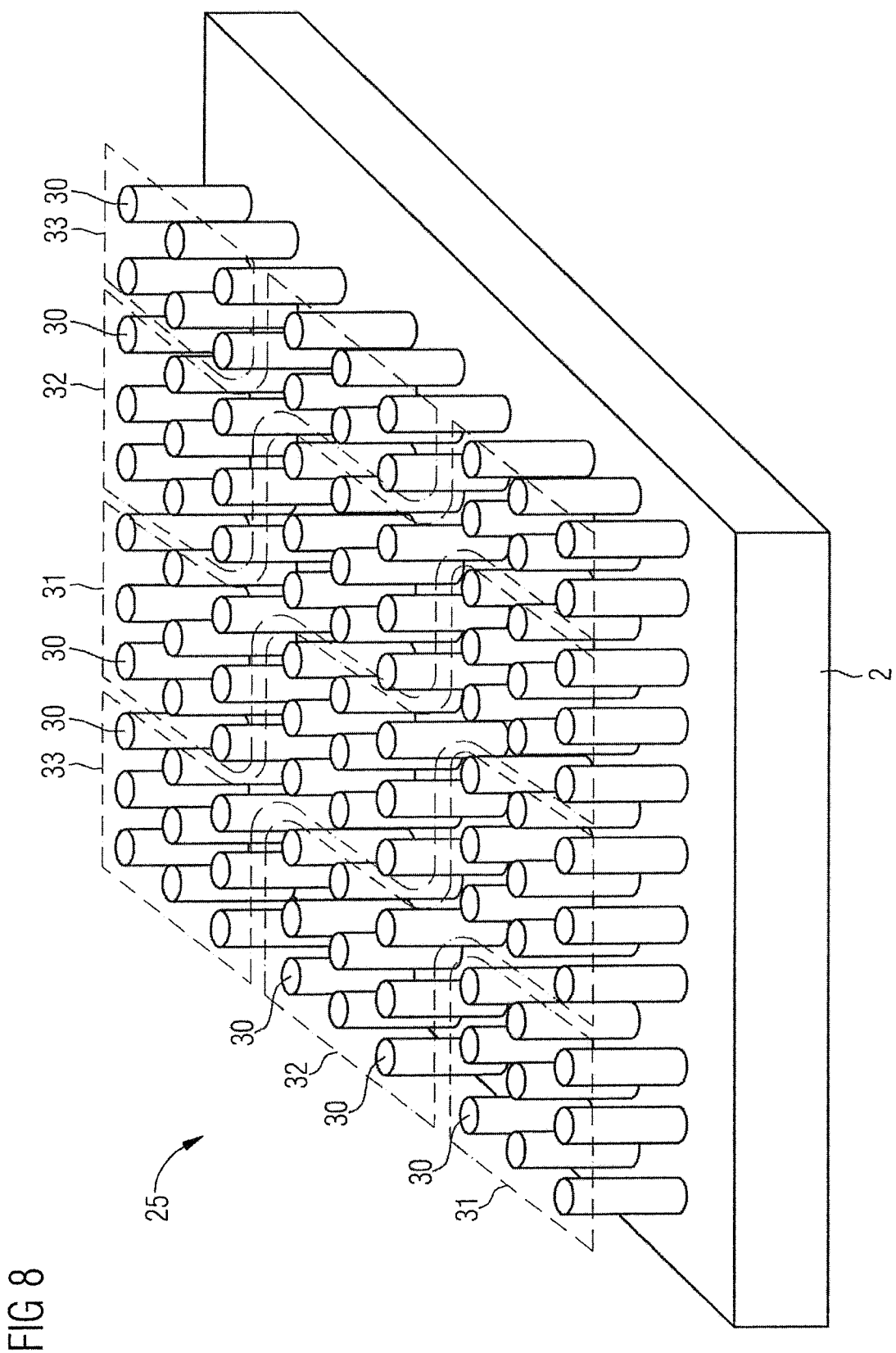
FIG. 8 shows a fourth example of an array.

FIG. 8 shows a further array 25 having a plurality of assemblies 30. In this example, regions 31, 32, 33 are provided in which assemblies 30 are arranged that emit electromagnetic radiation having the same wavelength distribution, in particular having the same wavelength, i.e., color. Therefore, regions having different wavelength spectra, i.e., different colors, are arranged on the array 25. An array can have a plurality of assemblies 30. The assemblies 30 are divided into three groups, for example. A first group generates light having a green color. A second group generates light having a red color and a third group generates light having a blue color. For a uniform color proportion, more assemblies 30 are provided that generate green light since the efficiency of the assemblies 30 generating green light is less than the efficiency of the assemblies 30 generating blue or red light. In this manner, an equalization in the efficiency and therefore in the color distribution can be performed by way of the number of the different assemblies.

Figure 9:
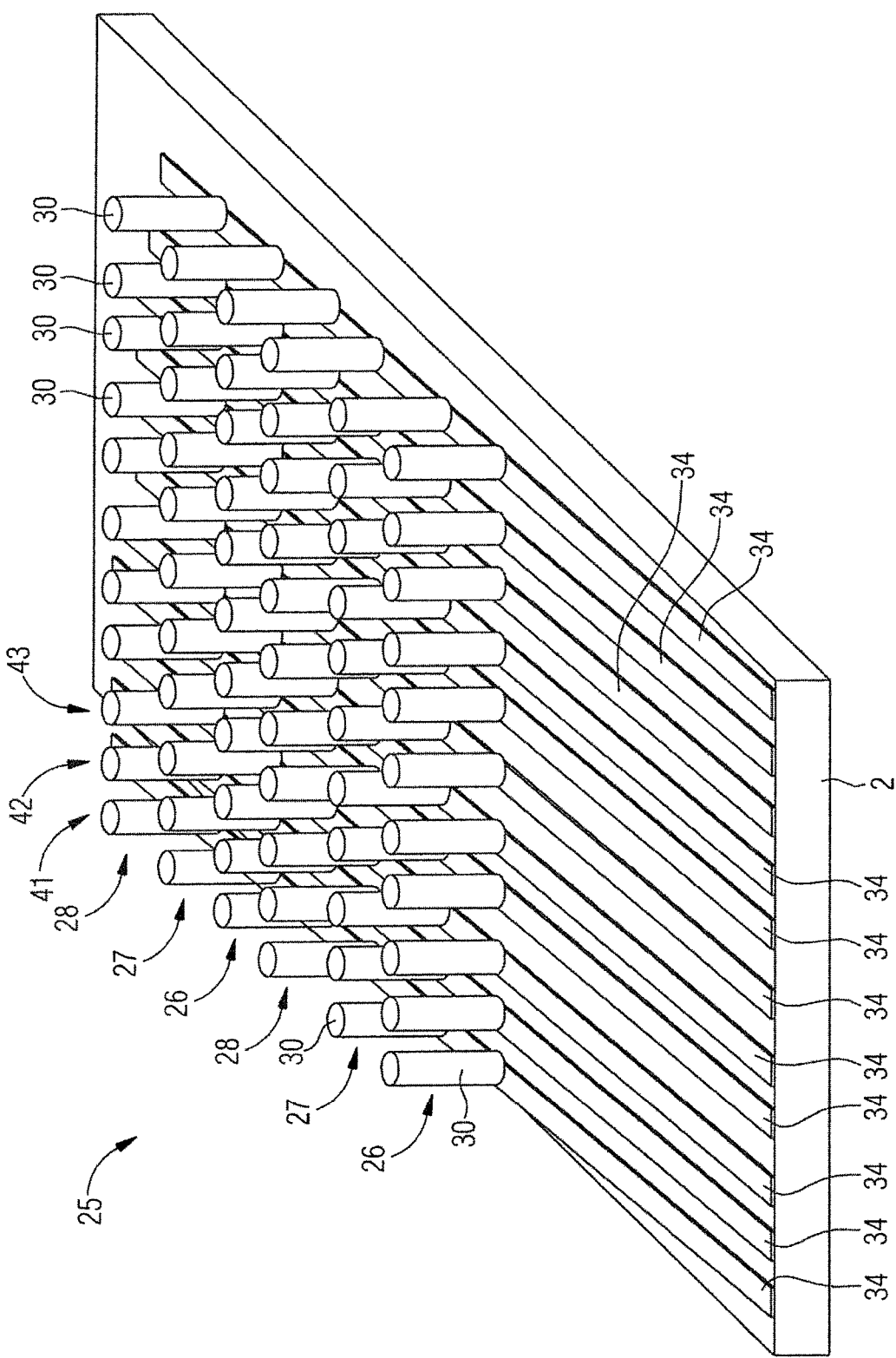
FIG. 9 shows a fifth example of an array.

FIG. 9 shows a further example of an array 25 in which the assemblies 30 are arranged in rows 26, 27, 28 and columns 41, 42, 43. The assemblies 30 of the first row 26 emit light in the red range. The assemblies 30 of the second row 27 emit light in the green color range. The assemblies 30 of the third row 28 emit light in the blue range. The assemblies 30 are arranged on an insulating carrier 2. Conductor strips 34 are arranged perpendicularly to the alignment of the rows 26, 27, 28. The conductor strips 34 represent an electrical contact for the first or the second contact layer 5, 6. The electrical contacting of the other contact layer is not explicitly shown. All first contacts of the assemblies 30 of one column are supplied with current via a conductor strip 34. The second contacts of the assemblies 30 can be supplied with current with the aid of a single further contact layer. Electrical activation is thus provided for the individual columns 41, 42, 43 of the assemblies 30.

Figure 10:
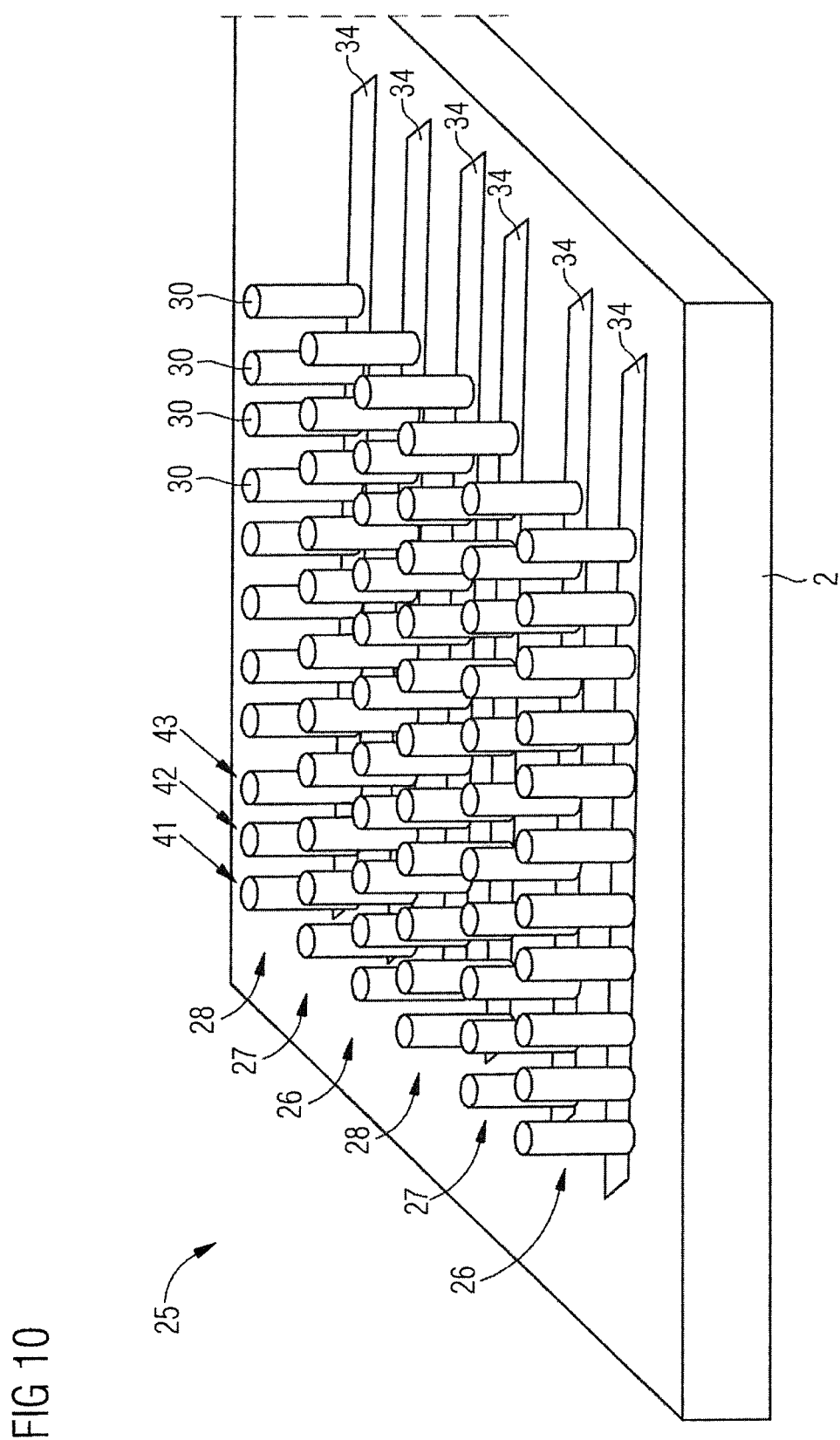
FIG. 10 shows a sixth example of an array.
Figure 11:
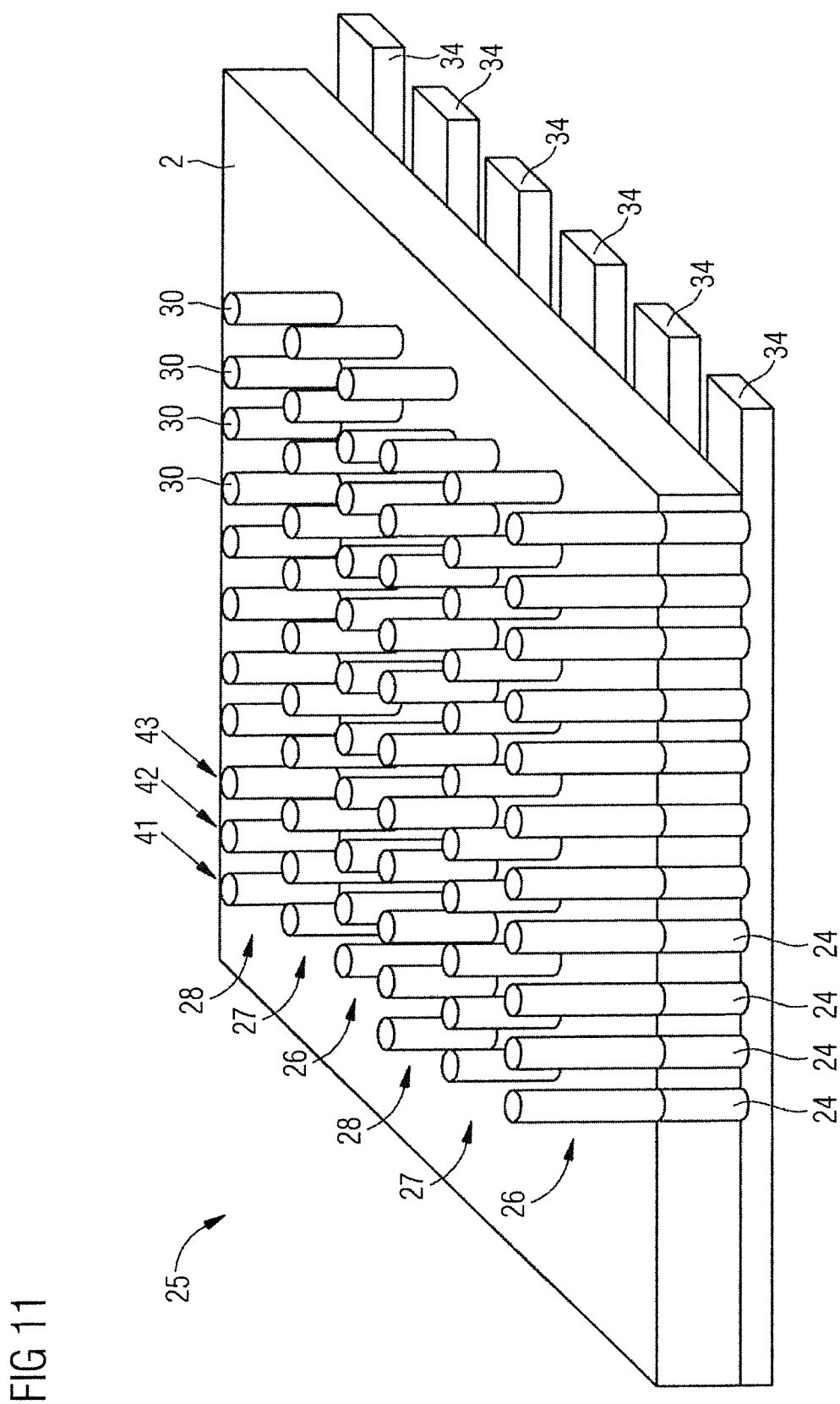
FIG. 11 shows a seventh example of an array.

The conductor strips 34 can also be arranged in parallel to the rows 26, 27, 28 as shown in FIG. 10. With the aid of this assembly, individual colors of the array 25 can be activated by the corresponding activation of the individual conductor strips 34. FIG. 11 shows a further example of an array 25 designed essentially according to the array of FIG. 10. Assemblies 30 are also arranged in rows 26, 27, 28 and columns 41, 42, 43 in this assembly. In each row 26, 27, 28, assemblies 30 are provided that emit electromagnetic radiation having the same wavelength spectrum, in particular having the same color. In this example, all assemblies 30 of a row 26, 27, 28 are electrically supplied with current with the aid of a conductor track 34. In contrast to the example of FIG. 10, through contacts 24 that connect the conductor tracks 34 to the respective electrical contact of the assemblies 30. In this manner, the conductor tracks 34 can be arranged on the lower side of the carrier 2. The conductor strips 34 can also be arranged in the carrier 2. The same electrically conductive material is preferably used for the electrical through contacts 24 as for the conductor strips 34. Contacting the second electrical contacts of the assemblies 30 is not explicitly shown in the illustration of FIG. 12.

Figure 12:
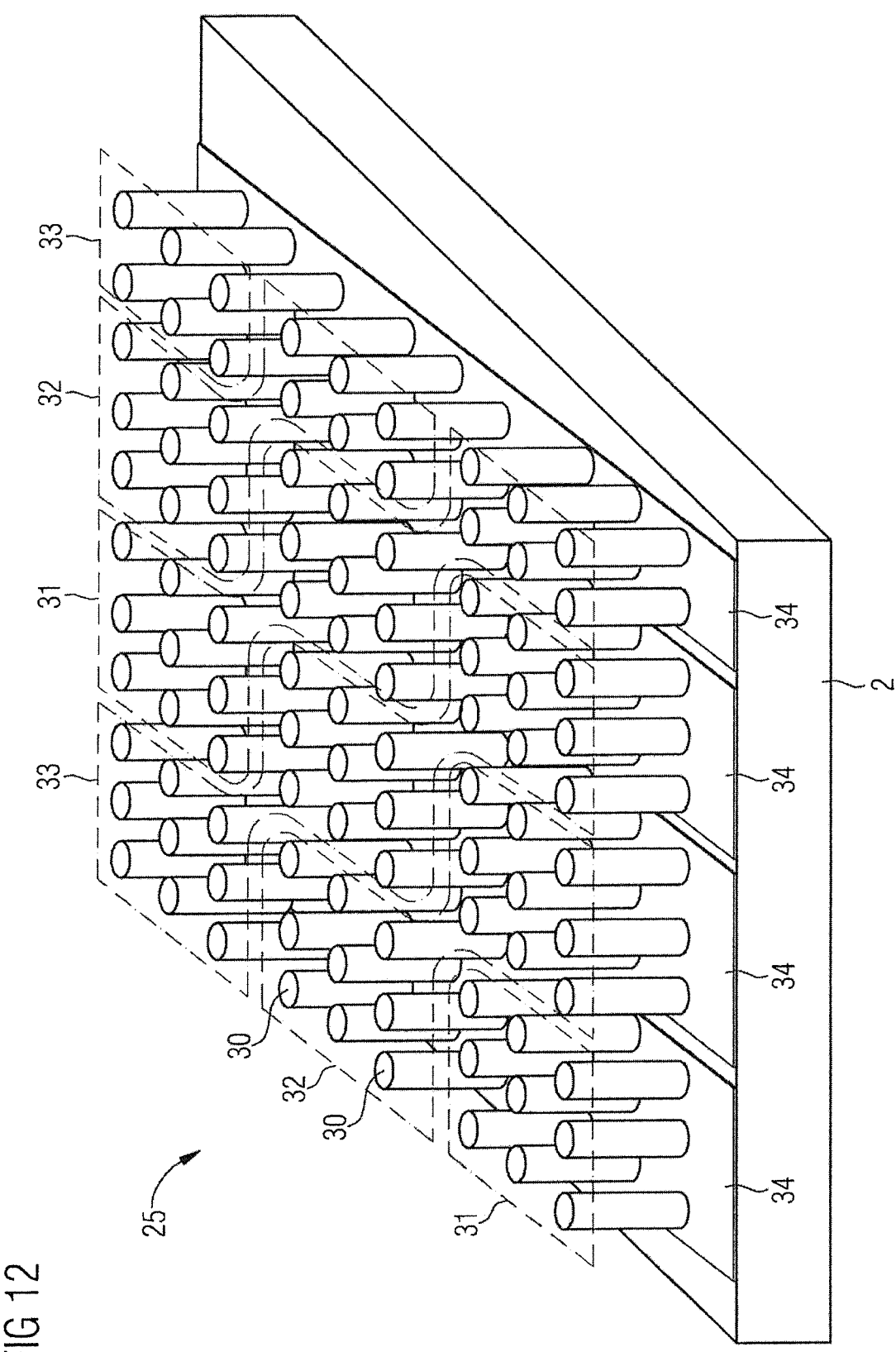
FIG. 12 shows an eighth example of an array.

FIG. 12 shows a further example in which the conductor strips 34 are formed wider and each conductor strip 34 supplies a plurality of assemblies 30 with current. The assemblies 30 of a conductor strip 34 can emit electromagnetic radiation having the same or different wavelengths. A block-by-block activation of the assemblies 30 is therefore enabled. Assemblies 30 having the same wavelength spectrum or having different wavelength spectra can be contacted via a conductor strip 34. In addition, regions 31, 32, 33 of assemblies 30 can also be contacted via a conductor strip 34, wherein the assemblies 30 of a region 31, 32, 33 emit the same wavelength spectrum. The assemblies 30 of the different regions 31, 32, 33 emit different wavelength spectra. The conductor strips 34 can be arranged on the carrier 2 as schematically shown in FIG. 12.

Figure 13:
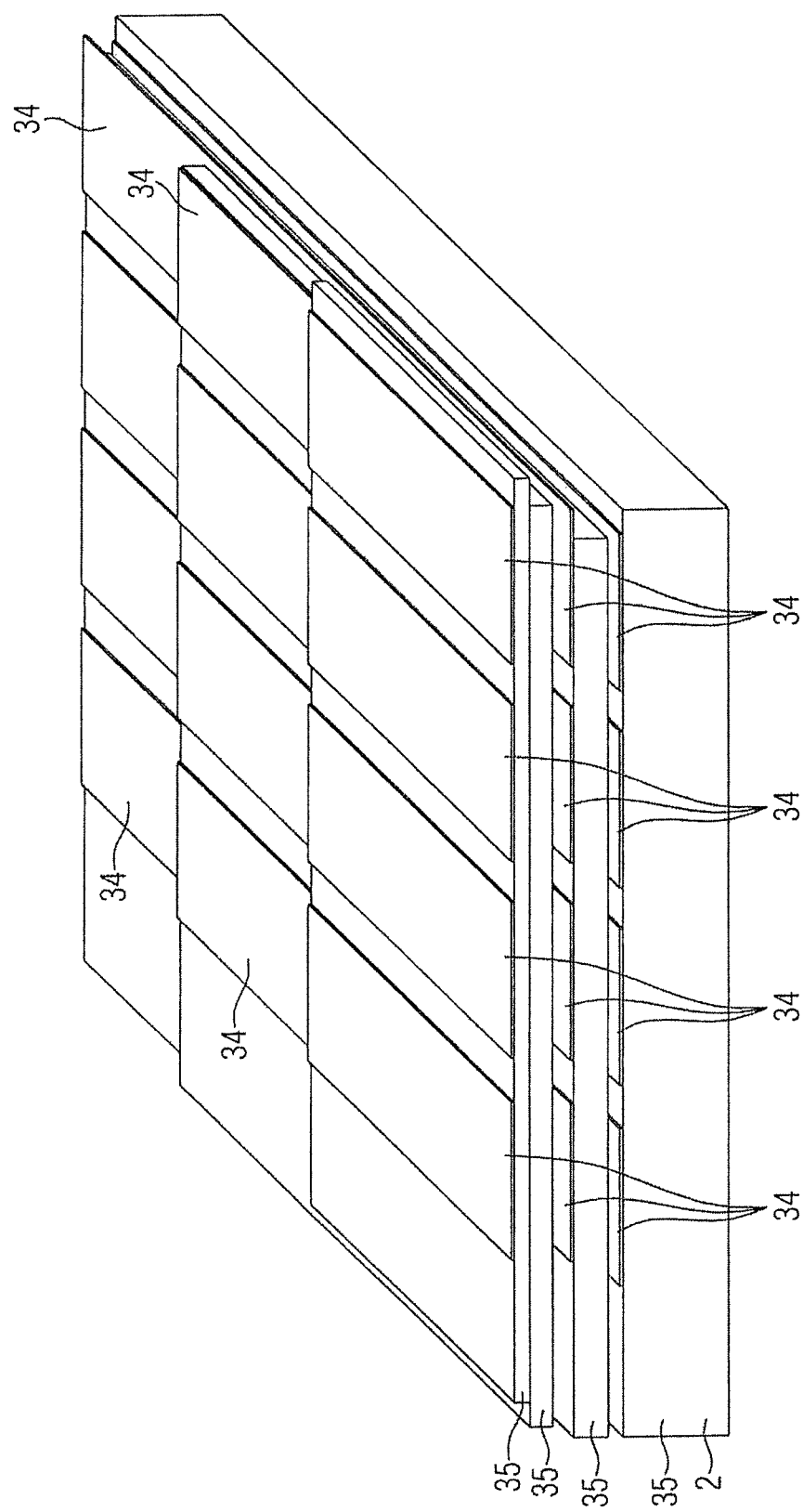
FIG. 13 shows a schematic illustration of conductor tracks.
Figure 14:
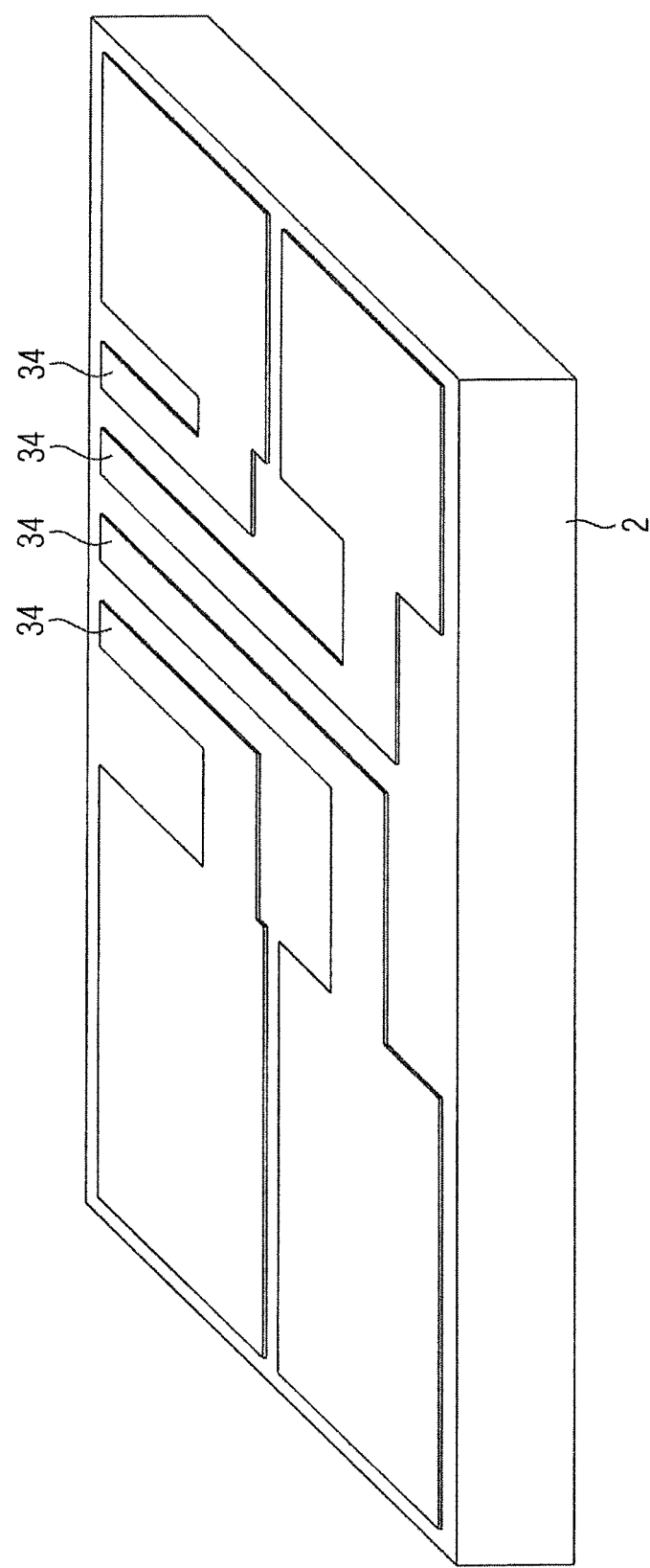
FIG. 14 shows a schematic illustration of a further example of conductor tracks.

In addition, the conductor strips 34 can also be formed on the lower side of the carrier or in the carrier 2 and can be led via through contacts 24 to the assemblies 30 through the carrier 2. In addition, conductor strips 34 can be arranged in various levels one above another to enable individual addressing of individual assemblies 30 or groups of assemblies 30. Electrically insulating layers 35 are arranged between the levels of the conductor strips 34 as schematically shown in FIG. 13. In addition, the conductor strips 34 can have different areas and geometries as shown in FIG. 14.

Figure 15:
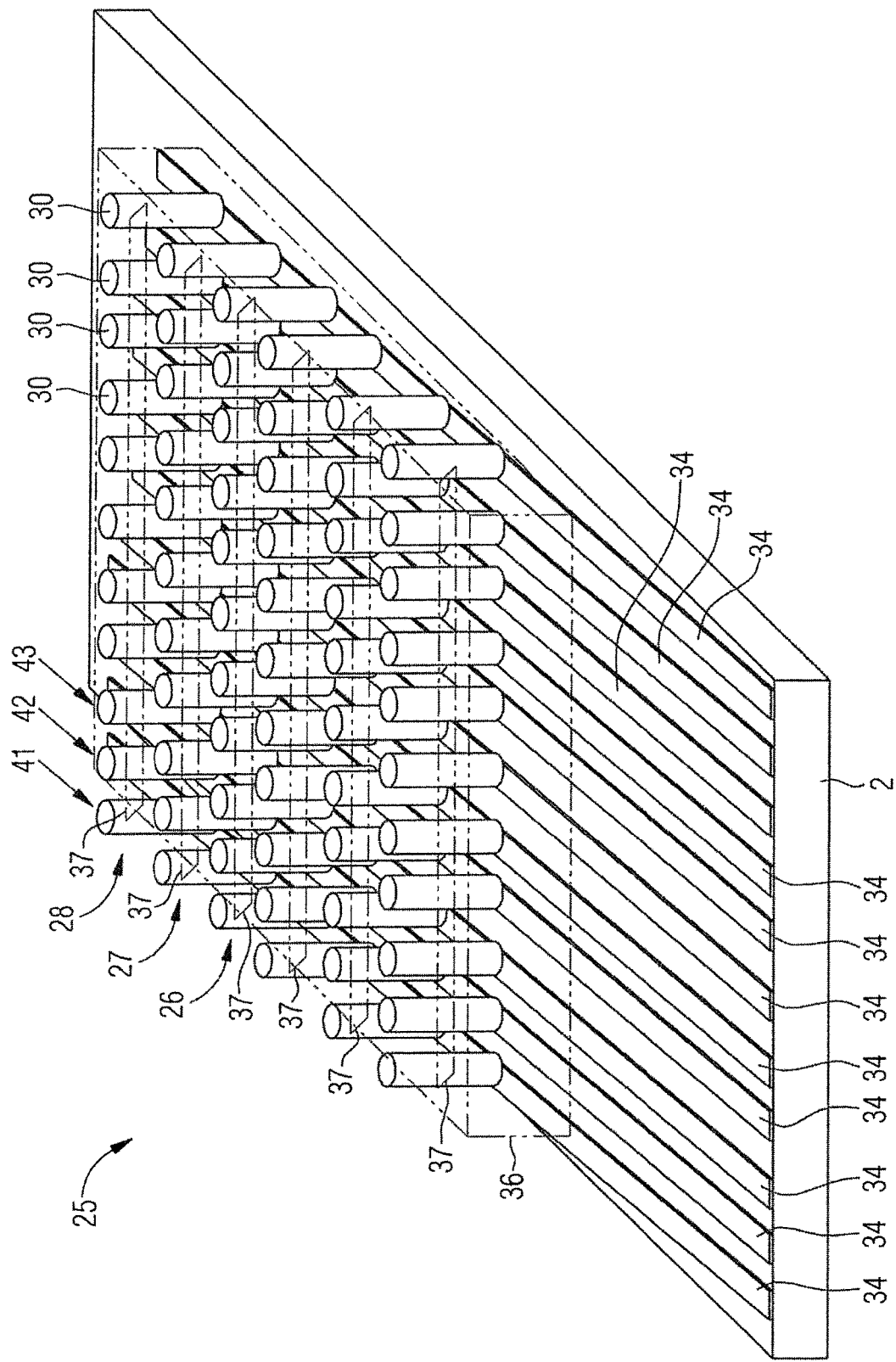
FIG. 15 shows an illustration of a further example of an array.

FIG. 15 shows an array 25 designed essentially according to the array of FIG. 9, wherein the assemblies 30 are additionally covered with a further insulating layer 36. Dielectric layers, for example, aluminum oxide, silicon oxide, zirconium oxide, titanium oxide, silicon nitride, tantalum oxide, polymers, photoresists, spin-on glass and the like, or combinations thereof can be used as the insulating layer 36. In addition, a further metallization 37 is applied onto or introduced into the further layer 36, to supply the assemblies 30 with current for the second contact layer. The insulating layer 36 is made of a material preferably transmissive to the electromagnetic radiation of the assemblies 30. The assemblies 30 can also protrude with the second end region 10 out of the insulating layer 36. The further metallization 37 can be arranged in the form of further conductor strips along a row 26, 27, 28 of assemblies 30 and can electrically contact the third contact layer 22 of the assemblies 30 laterally. With the aid of the crossed arrangement of the conductor strips 34 and the further conductor strips 37, individual assemblies 30 are individually electrically activatable.

Figure 16:
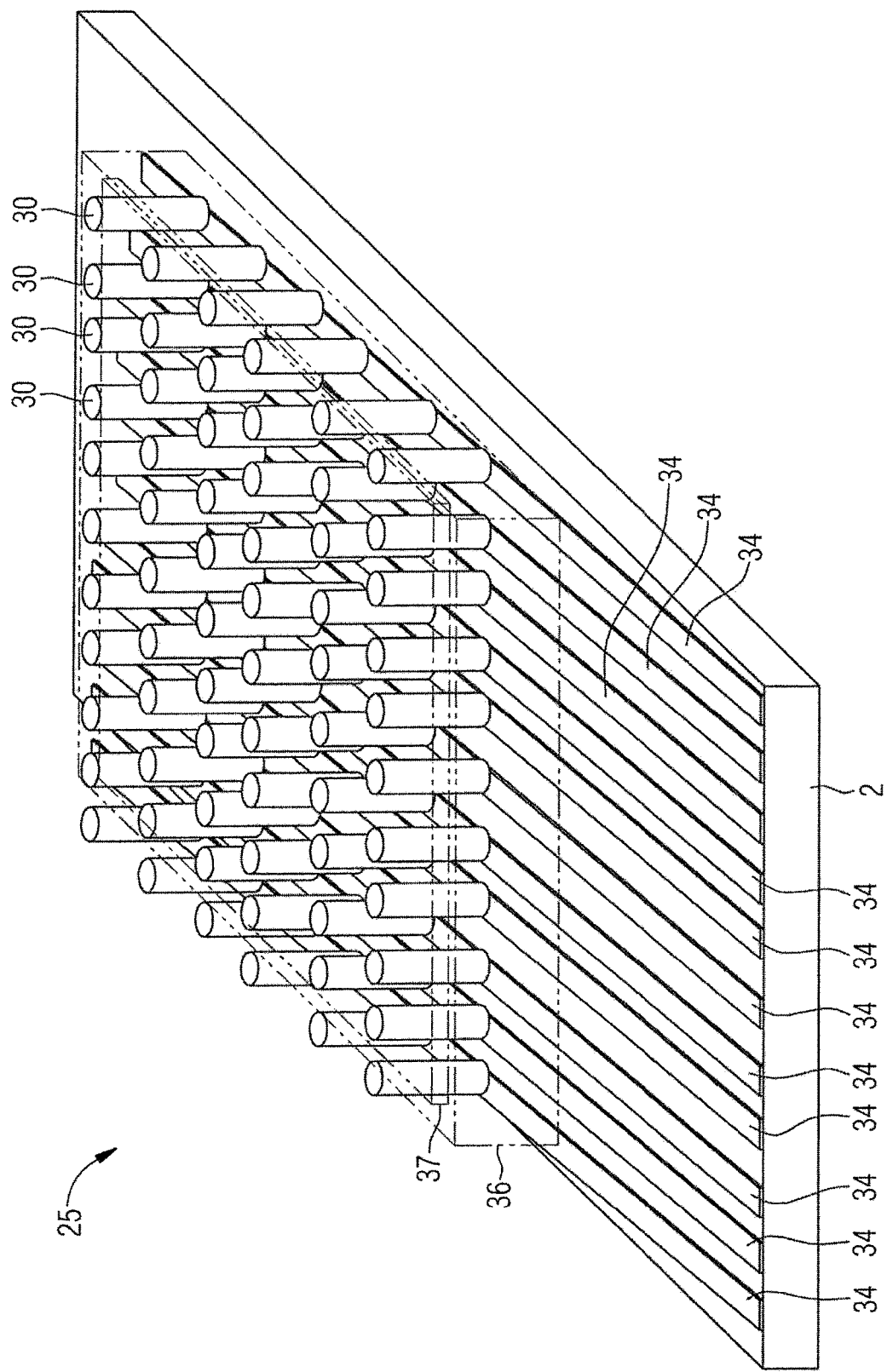
FIG. 16 shows an illustration of a further example of an array.

FIG. 16 shows a further example of an array 25 designed essentially according to the example of FIG. 15. In contrast to the example of FIG. 15, a full-area metallization 37 is not provided, which electrically contacts all assemblies 30 on the third contact layer 22. The metallization 37 is formed on the second end regions 10 of the assemblies 30 or between the assemblies 30. The metallization 37 is preferably made of a material transmissive to the electromagnetic radiation of the assemblies 30.

Figure 17:
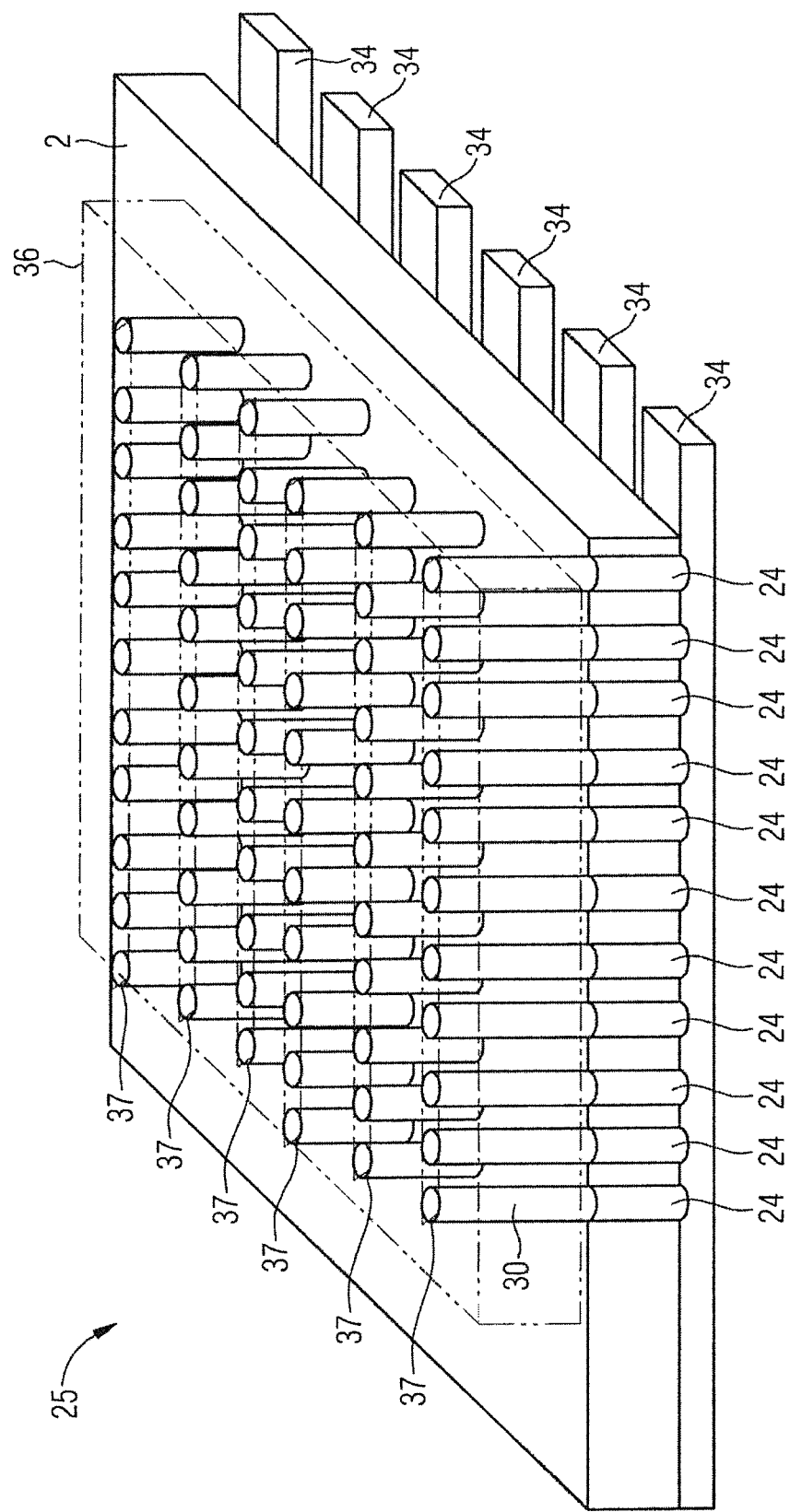
FIG. 17 shows a further example of an array.

FIG. 17 shows a further example of an array 25 essentially corresponding to the assembly of FIG. 15, wherein, however, the conductor strips 34 are arranged on the lower side of the carrier and are led via through contacts 24 to the first contact layers 5 of the assemblies 30. The conductor strips 34 are arranged in parallel to the rows 31, 32, 33 of the assemblies 30. The metallizations 37 in the form of further conductor strips are also arranged in parallel to the conductor strips 34. Individual rows can each be activated in this arrangement. This is achieved in that the further conductor strips 38 and the conductor strips 34 are arranged in parallel to one another.

Figure 18:
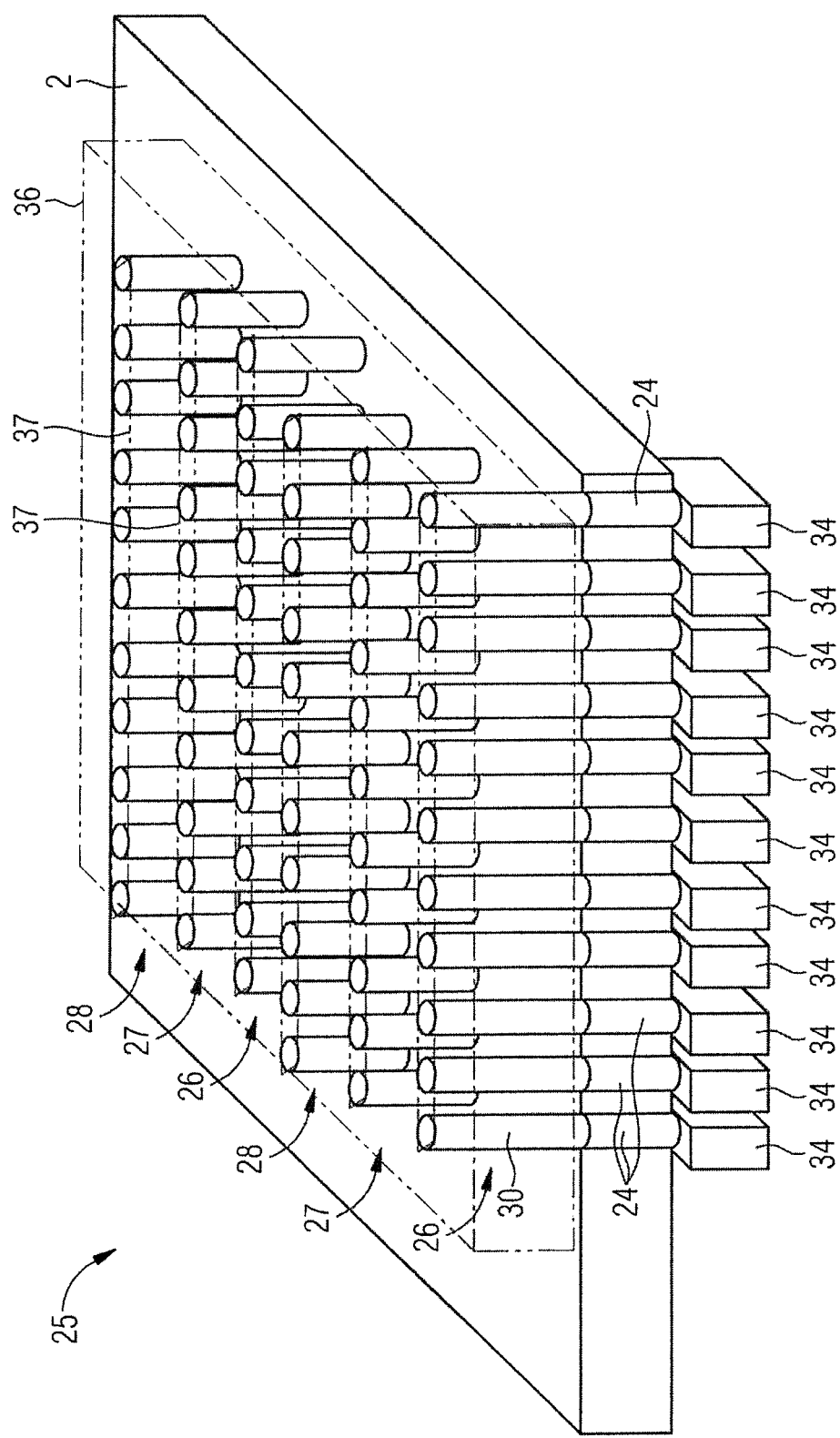
FIG. 18 shows a further example of an array.

FIG. 18 shows a further example essentially corresponding to the assembly of FIG. 17, wherein, however, the metallizations 37 and the conductor strips 34 are arranged at right angles to one another. Individual assemblies 30 can thus be activated by a corresponding current supply of the conductor strips 34 and the further conductor strips 38. The conductor strips 34 are arranged perpendicularly to the rows 31, 32, 33.

Figure 19:
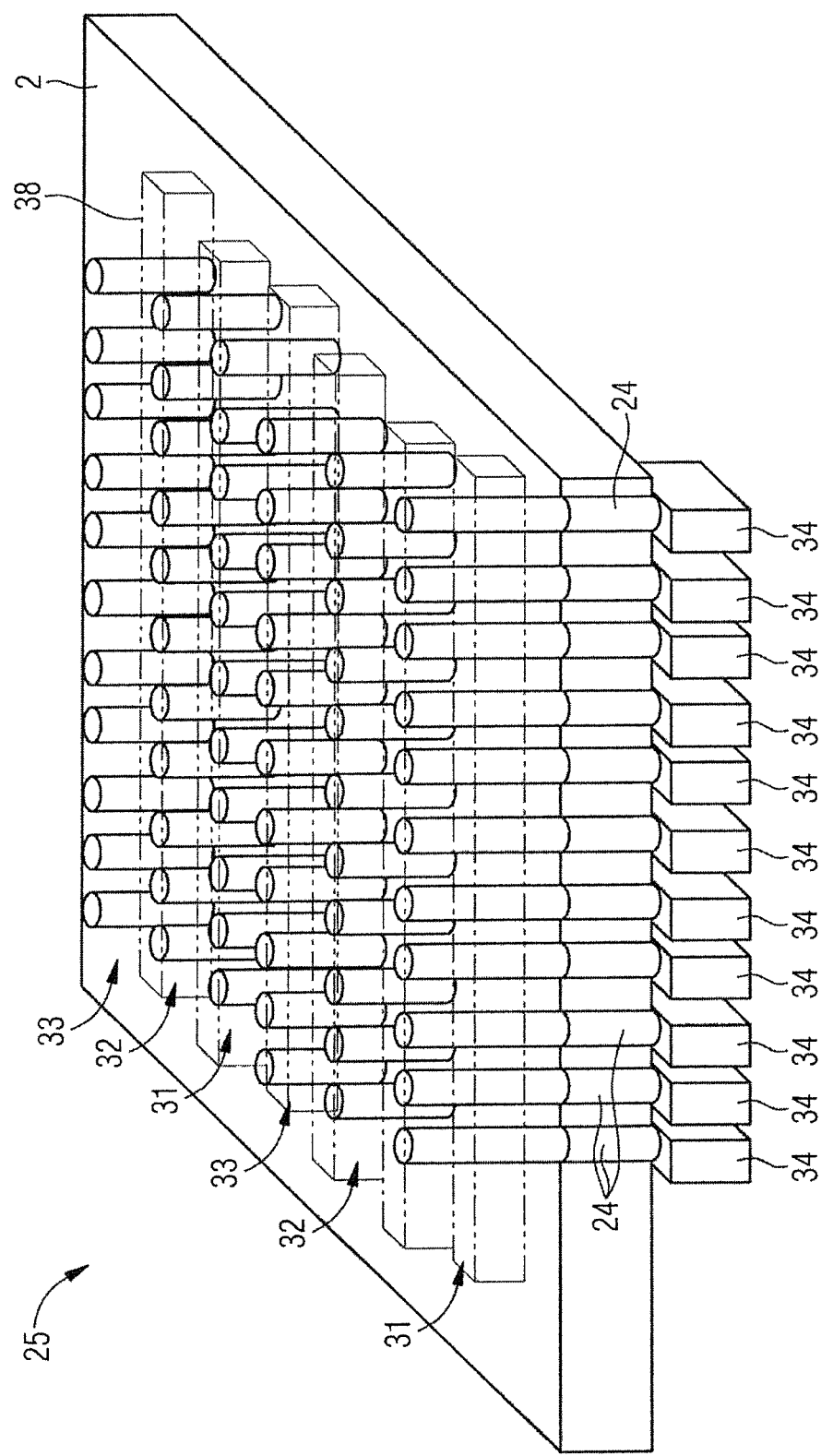
FIG. 19 shows a further example of an array.

FIG. 19 shows a further example essentially corresponding to the assembly of FIG. 18. In contrast to FIG. 18, the rows of assemblies are electrically contacted via further conductor strips 38 arranged on the upper side of the substrate and laterally contact the assemblies 30. The further conductor strips 38 are arranged perpendicularly to the conductor strips 34. The insulating layer 35 was omitted in this example. The assemblies 30 can be epitactically grown on a substrate as a carrier, for example, with the aid of a MOVPE method. Corresponding precursors are used for this purpose to deposit the core 3 and the zone layer 4.

Figure 20:
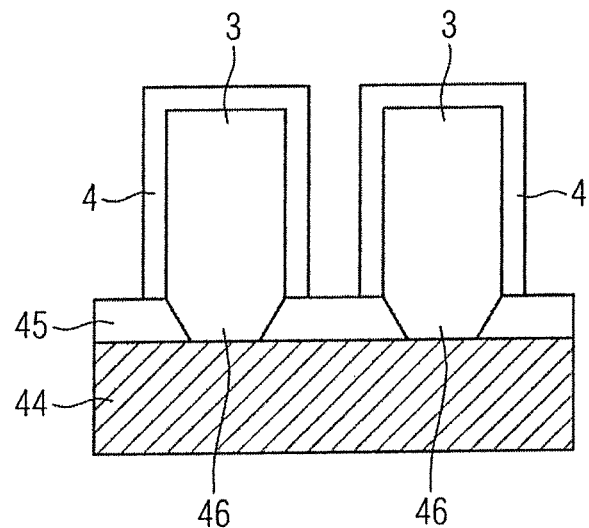
FIG. 20 shows a schematic cross section through a growth substrate.
Figure 21:
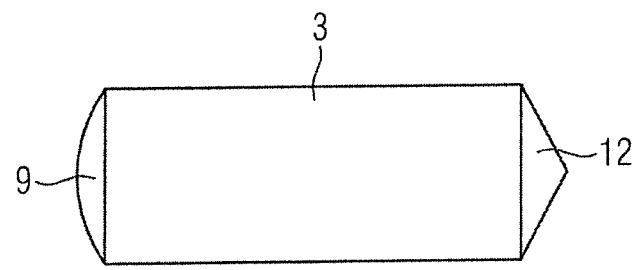
FIG. 21 shows an intermediate product.
Figure 22:
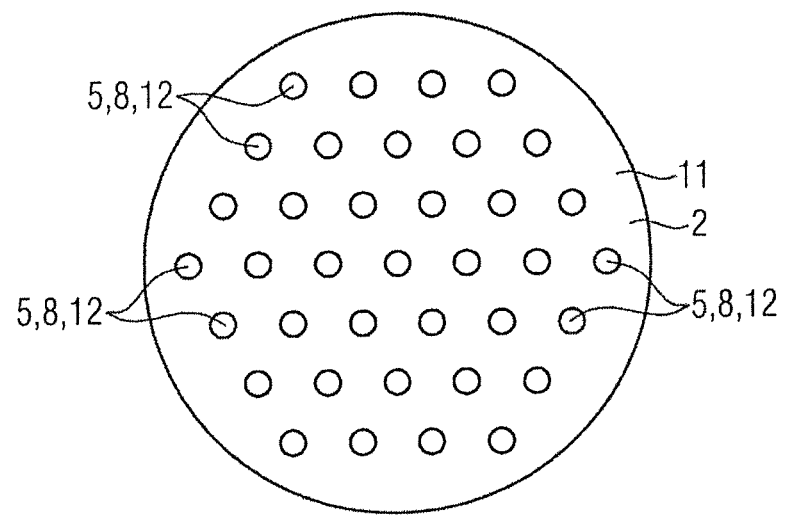
FIG. 22 shows a carrier.

In a further example, the assemblies 30 can be produced according to a method which will be explained on the basis of FIGS. 20 to 22. In this method, a mask layer 45 is applied to a growth substrate 44. The growth substrate 44 has a crystal structure. The mask layer 45 has further openings 46. Cores 3 are epitactically grown on the growth substrate 44 in the further openings 46, for example, with the aid of a MOVPE method, as shown in FIG. 20. The cores 3 represent an intermediate product. The zone layers 4 can also be applied to the cores 3 in addition to the cores 3. In a following method step, the cores 3 are detached from the growth substrate 44. This method state is shown in FIG. 21. Subsequently, the cores 3 are applied to a carrier 2 shown in FIG. 22. The carrier 2 has a first mask layer 11 having openings 12 in which a mirror layer 8 is arranged. The mirror layer 8 can simultaneously represent a first contact layer 5. However, a separate first contact layer 5 and/or a second mirror layer can also be provided, as was explained on the basis of FIGS. 1 to 4.

The cores 3 are inserted into the openings 12 and fastened to the carrier 2. In addition, a second mirror layer is preferably applied to the free second end 10 of the core 3. Subsequently, as already explained, electrically conductive contacts are attached to the assemblies 10. If only a core 3 is used as the intermediate product subsequently fastened on the carrier 2, the active zone layer 4 is thus deposited on the core 3 on the carrier 2. For this purpose, the carrier 2 is introduced into a deposition facility. In addition, a corresponding second mirror layer can also be applied to the second end region 10 of the core 3.

The cores or the cores having the zone layers 4, which are applied to the carrier 2, can differ in the construction, i.e., in the structure, in the material, in the geometry, or in the zone layer 4, in particular in the electromagnetic radiation generated by the zone layer 4. Carriers 2 can thus be accordingly equipped with different assemblies according to a desired power and a desired wavelength spectrum of the emitted electromagnetic radiation.

In addition, with the aid of the described method, a cost-effective carrier 2 can be used, although the cores 3 have a crystal structure which was assumed from the growth substrate 40. The crystal structure ensures a good quality of the layer structure of the core 3 and/or the layer structure of the zone layer 4. In particular, flaws and/or crystal defects are avoided. An array having high-quality assemblies 30 can therefore be provided with the aid of the described method, although cost-effective carriers 2 are used.

With the aid of the described assemblies 30, for example, laser diodes are produced cost-effectively, which can provide a high electromagnetic radiation density with little space required. A high quality of the deposited, in particular epitactically deposited semiconductor material is ensured by the use of nanostructures. The electrical and optical properties of the laser diode are thus improved. By way of the use of an epitactically deposited first mirror layer 16, a desired semiconductor crystal structure can be predefined. This crystal structure is also assumed during the epitactic deposition of the core 3 and/or the zone layer 4.

Furthermore, the crystal information can also be achieved if only one second mirror layer and a first contact layer 5 applied thereon are used. In this example, the crystal information is predefined by the second mirror layer 13 and transferred to the core 3 during the epitactic deposition because of the thin first contact layer 5.

This application claims priority of DE 10 2013 211 707.8, the disclosure of which is hereby incorporated by reference.

The invention claimed is:

1. An assembly comprising a carrier and a structure having a core formed on the carrier, wherein the core has a longitudinal extension having two end regions, a first end region is arranged facing toward the carrier and a second end region is arranged facing away from the carrier, the core is formed as electrically conductive at least in an outer region, the outer region is at least partially covered with an active zone layer, the active zone layer generates electromagnetic radiation, a mirror layer is provided at least in one end region of the core to reflect electromagnetic radiation in a direction, a first electrical contact layer contacts an electrically conductive region of the core, and a second contact layer contacts the active zone layer, wherein the mirror layer has an electrically conductive first mirror layer, which is arranged on the first end region of the core, and a second mirror layer, the first electrical contact layer has a top surface and a bottom surface where the first mirror layer is in direct contact with the top surface and the second mirror layer is in direct contact with the bottom surface, the second mirror layer is electrically insulating, and the first mirror layer has a lower degree of reflection than the second mirror layer.

2. The assembly as claimed in claim 1, wherein an insulation layer is provided between the active zone layer and the first electrical contact layer and/or between the first contact layer and the second contact layer.

3. The assembly as claimed in claim 1, wherein the mirror layer is provided on the first end region of the core facing toward the carrier, and/or a further mirror layer is provided on the second end region of the core facing away from the carrier, and wherein a direction of reflection of the electromagnetic radiation is arranged along a longitudinal axis of the core.

4. The assembly as claimed in claim 3, wherein the further mirror layer is applied directly to the core or to the active zone layer, which covers the second end region of the core.

5. The assembly as claimed in claim 1, wherein the mirror layer is electrically conductive and represents a contact layer for the electrical contacting of the core.

6. The assembly as claimed in claim 1, wherein an electrical through contact is provided in the carrier, and the through contact connects in an electrically conductive manner to the first contact layer.

7. The assembly as claimed in claim 1, wherein the first electrical contact layer is in contact with a first partial layer of the active zone layer, which adjoins the core.

8. The assembly as claimed in claim 1, wherein the active zone layer encloses the core in the form of a jacket along a longitudinal axis.

9. The assembly as claimed in claim 1, wherein the second contact layer laterally contacts the active zone layer.

10. The assembly as claimed in claim 1, wherein the mirror layer is in the form of a layer sequence.

11. An array comprising multiple assemblies as claimed in claim 1, wherein the first and/or the second contact layer of at least two assemblies are formed independently of one another and the two assemblies can be supplied separately and independently of one another with current to generate electromagnetic radiation.

12. The array as claimed in claim 11, wherein the first and/or the second contact layer of multiple assemblies are in the form of a conductor strip, and multiple conductor strips are separate from one another.

13. A method of producing an assembly as claimed in claim 1, comprising producing an intermediate product on a growth substrate, wherein the intermediate product at least comprises the core, removing the intermediate product from the growth substrate and applying the intermediate product to a carrier to finish the assembly.

14. The method as claimed in claim 13, wherein the intermediate product has the core and the active zone layer.

15. An assembly comprising a carrier and a structure having a core formed on the carrier, wherein the core has a longitudinal extension having two end regions, a first end region is arranged facing toward the carrier and a second end region is arranged facing away from the carrier, the core is formed as electrically conductive at least in an outer region, the outer region is at least partially covered with an active zone layer, the active zone layer generates electromagnetic radiation, a mirror layer is provided at least in one end region of the core to reflect electromagnetic radiation in a direction, a first electrical contact layer contacts an electrically conductive region of the core, a second contact layer contacts the active zone layer, the mirror layer is provided on the first end region of the core facing toward the carrier, and the mirror layer is provided on the second end region of the core facing away from the carrier, a direction of a reflection of the electromagnetic radiation is arranged along a longitudinal axis of the core, the mirror layer has an electrically conductive first mirror layer, which is arranged on the first end region of the core, and a second mirror layer, the first electrical contact layer has a top surface and a bottom surface where the first mirror layer is in direct contact with the top surface and the second mirror layer is in direct contact with the bottom surface, the second mirror layer is electrically insulating, and the first mirror layer has a lower degree of reflection than the second mirror layer.

16. An assembly comprises a carrier and a structure having a core formed on the carrier, wherein the core has a longitudinal extension having two end regions, a first end region is arranged facing toward the carrier and a second end region is arranged facing away from the carrier, the core is formed as electrically conductive at least in an outer region, the outer region is at least partially covered with an active zone layer, the active zone layer generates electromagnetic radiation, a mirror layer is provided at least in one end region of the core to reflect electromagnetic radiation in a direction, a first electrical contact layer contacts an electrically conductive region of the core, and a second contact layer contacts the active zone layer, wherein the mirror layer has an electrically conductive first mirror layer, which is arranged on the first end region of the core, and a second mirror layer, the first electrical contact layer has a top surface and a bottom surface where the first mirror layer is in direct contact with the top surface and the second mirror layer is in direct contact with the bottom surface, and the second mirror layer is electrically insulating.

* * * * *